(12) United States Patent
Hashigami

(10) Patent No.: US 12,556,194 B2
(45) Date of Patent: Feb. 17, 2026

(54) SUCCESSIVE APPROXIMATION AD CONVERTER CIRCUIT

(71) Applicant: ROHM Co., LTD., Kyoto (JP)

(72) Inventor: Mamoru Hashigami, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 266 days.

(21) Appl. No.: 18/360,060

(22) Filed: Jul. 27, 2023

(65) Prior Publication Data

US 2024/0039553 A1 Feb. 1, 2024

(30) Foreign Application Priority Data

Jul. 29, 2022 (JP) .................. 2022-121326

(51) Int. Cl.
*H03M 1/38* (2006.01)
(52) U.S. Cl.
CPC .................. *H03M 1/38* (2013.01)
(58) Field of Classification Search
CPC ...... H03M 1/38; H03M 1/1245; H03M 1/462; H03M 1/68; H03M 1/804; H03M 1/468
USPC ......................... 341/144, 172, 161
See application file for complete search history.

(56) References Cited

U.S. PATENT DOCUMENTS

| | | | | |
|---|---|---|---|---|
| 9,362,939 B1* | 6/2016 | Rath | ............... | H03M 1/145 |
| 10,340,939 B1* | 7/2019 | Paul | ............... | H03M 1/68 |
| 10,862,497 B1* | 12/2020 | Lin | ............... | H03M 1/1245 |
| 2012/0319880 A1* | 12/2012 | Matsumoto | ......... | H03M 1/0682 |
| | | | | 341/122 |

FOREIGN PATENT DOCUMENTS

JP 2019080292 5/2019

* cited by examiner

*Primary Examiner* — Jean B Jeanglaude
(74) *Attorney, Agent, or Firm* — CHIP Law Group

(57) ABSTRACT

Provided is a successive approximation AD converter circuit that converts an analog input signal into a digital output signal. The successive approximation AD converter circuit includes a capacitor DAC including a capacitor array and a switch array connected to the capacitor array, a comparator connected to first comparison wiring and second comparison wiring, and a control circuit that determines a value of the digital output signal while controlling a state of the switch array. The capacitor array includes a first local array provided between the first comparison wiring and the switch array and a second local array provided between target wiring and the switch array. The capacitor DAC is provided with a scaling capacitor between the target wiring and the first comparison wiring and is provided with a potential fixing switch between the target wiring and the wiring to which the analog input signal is applied.

14 Claims, 19 Drawing Sheets

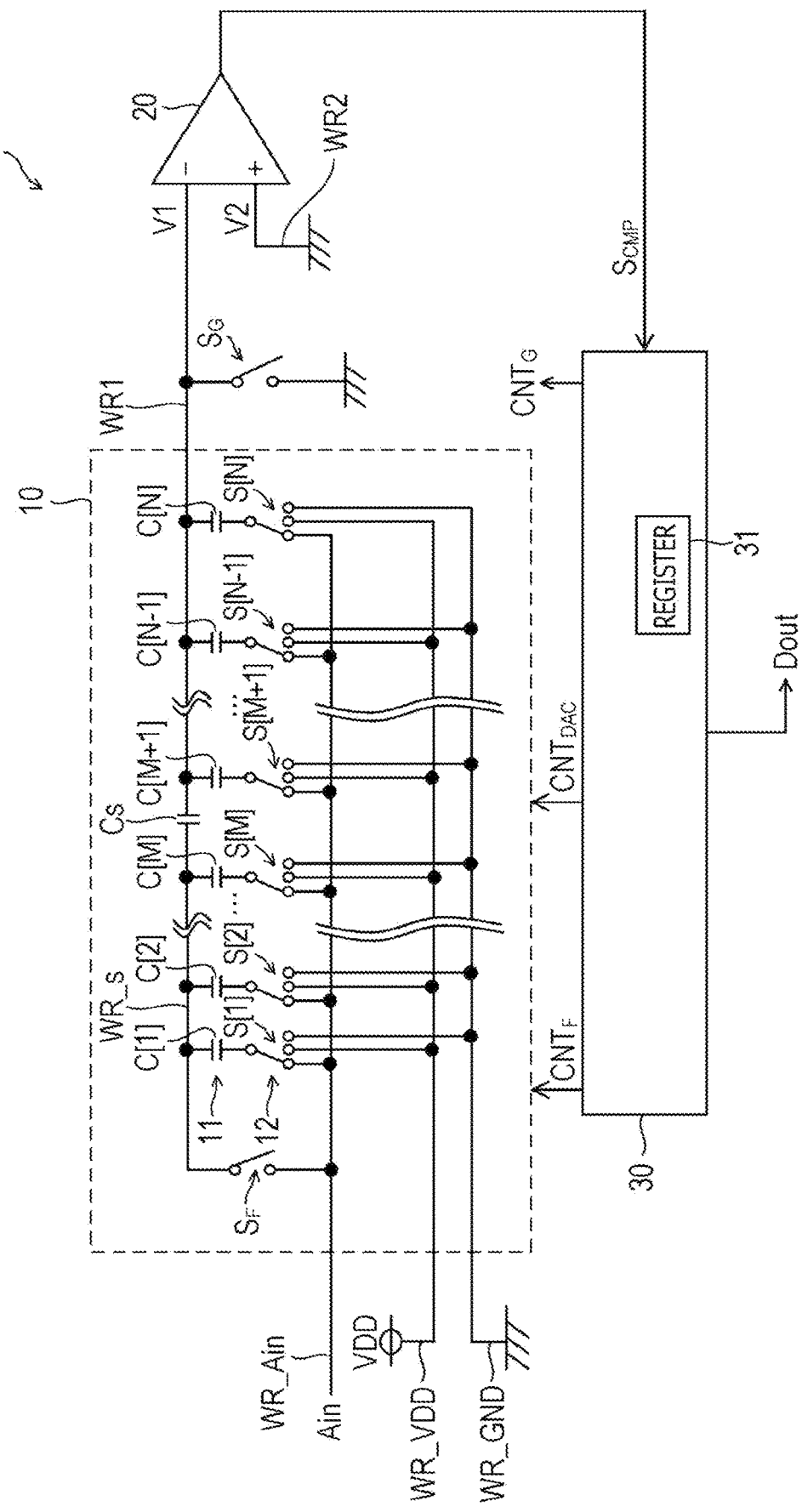
F I G . 1

[STATE TRANSITION OPERATION]

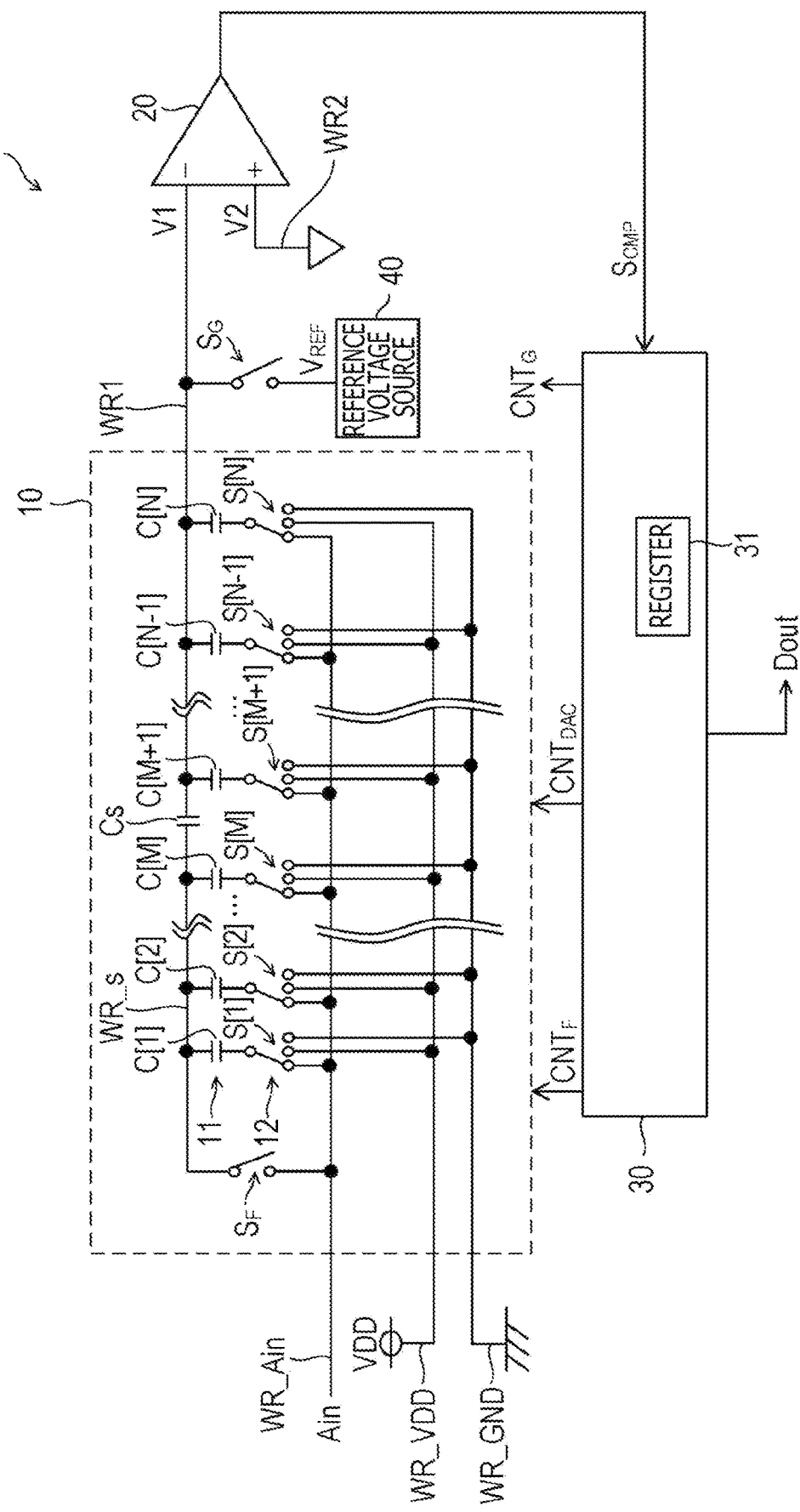
F I G . 1 4

[STATE TRANSITION OPERATION]

SUCCESSIVE APPROXIMATION AD CONVERTER CIRCUIT

CROSS REFERENCE TO RELATED APPLICATIONS

This application claims priority benefit of Japanese Patent Application No. JP 2022-121326 filed in the Japan Patent Office on Jul. 29, 2022. Each of the above-referenced applications is hereby incorporated herein by reference in its entirety.

BACKGROUND

The present disclosure relates to a successive approximation analog-to-digital (AD) converter circuit.

A successive approximation AD converter circuit typically includes a digital-to-analog converter (DAC), a comparator, and a logic circuit (control circuit) that performs successive approximation. A capacitor DAC (capacitive DAC) is often used as the DAC (see Japanese Patent Laid-Open No. 2019-80292, for example). In a capacitor array of the capacitor DAC, a scaling capacitor (series capacitance) is generally provided in order to reduce a capacitance ratio between a capacitor having a maximum capacitance value and a capacitor having a minimum capacitance value.

BRIEF DESCRIPTION OF THE DRAWINGS

FIG. 1 is a general configuration diagram of an AD converter according to a first embodiment of the present disclosure;

FIG. 14 relates to an example EX2_1 belonging to a second embodiment of the present disclosure, and is a general configuration diagram of an AD converter;

DETAILED DESCRIPTION

Figure 2:
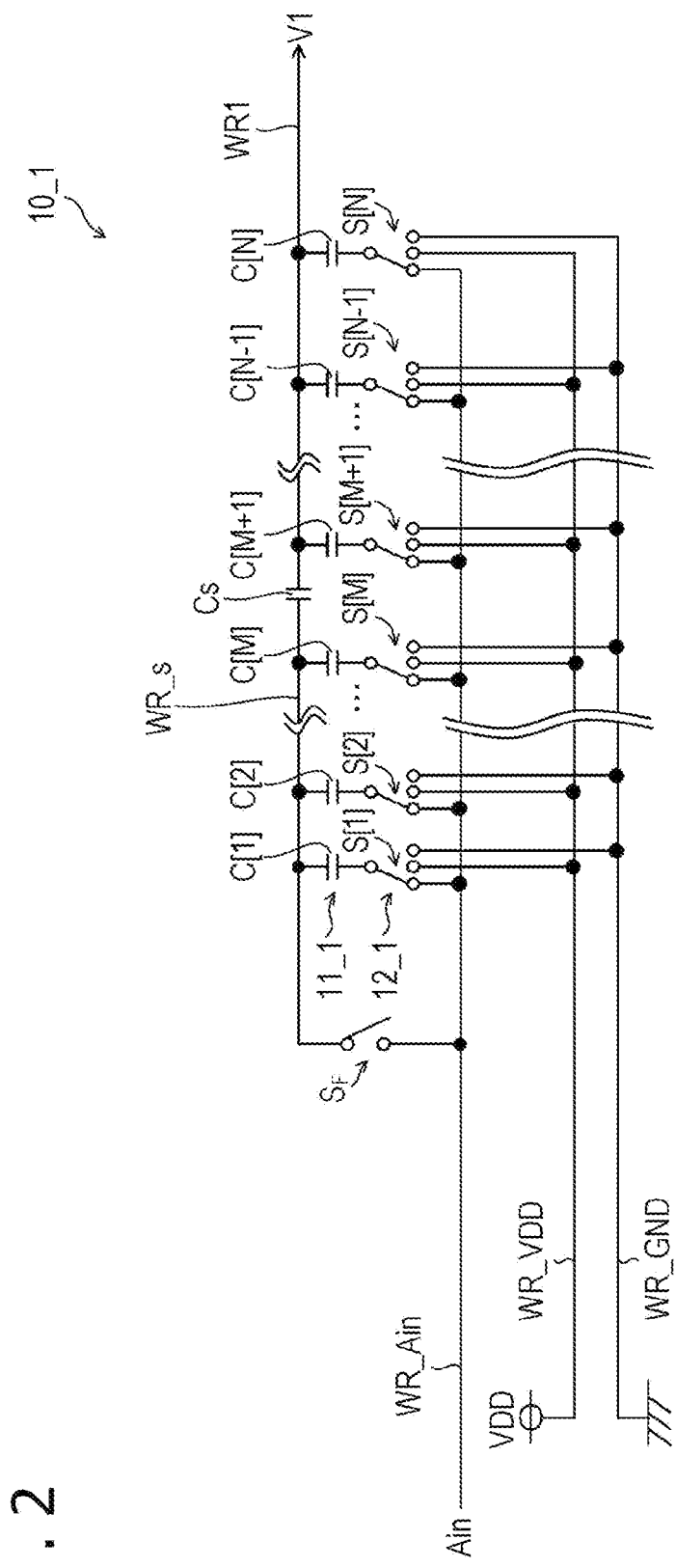
FIG. 2 is a diagram illustrating an example of a configuration of a DAC illustrated in FIG. 1.

Examples of embodiments of the present disclosure will hereinafter be described specifically with reference to the drawings. In the drawings to be referred to, the same parts are identified by the same reference signs, and repeated description of the same parts will be omitted in principle. Incidentally, in the present specification, for simplification of description, the names of information, signals, physical quantities, functional sections, circuits, elements, parts, or others corresponding to symbols or reference signs referring to the information, the signals, the physical quantities, the functional sections, the circuits, the elements, the parts, or others may be omitted or abbreviated by indicating the symbols or the reference signs. For example, a scaling capacitor referred to by "Cs," which scaling capacitor will be described later (see FIG. 1), may be written as a scaling capacitor Cs, or may be abbreviated as a capacitor Cs. However, the scaling capacitor Cs and the capacitor Cs each refer to the same thing. In the present specification, connection between a plurality of parts forming a circuit, the plurality of parts being given circuit elements, wiring, nodes, and other parts, may be interpreted as referring to electric connection unless otherwise specified.

First Embodiment

A first embodiment of the present disclosure will be described. FIG. 1 represents a general configuration diagram of an AD converter 1 according to the first embodiment. The AD converter 1 is a successive approximation A/D converter circuit. An analog input signal Ain is input to the AD converter 1. The AD converter 1 performs an AD conversion operation on the analog input signal Ain. The AD conversion operation on the analog input signal Ain converts the analog input signal Ain into a digital signal by a binary search, and outputs the resulting digital signal as a digital output signal Dout.

The digital output signal Dout is a digital signal of N bits. That is, the digital output signal Dout has a total of N bits from a first bit to an Nth bit. N is a given integer of two or more, and is, for example, 8, 10, 12, 14, or 16. Here, suppose that an (i+1)th bit as viewed from an ith bit is a bit on a higher order side. Hence, of the first to Nth bits, the first bit is a least significant bit, and the Nth bit is a most significant bit. i may be interpreted as denoting a given integer, and denoting a natural number equal to or less than N.

The AD converter 1 includes a DAC 10, a comparator 20, a control circuit 30, and a switch $S_G$. Wiring WR_Ain is analog input wiring to which the analog input signal Ain is applied. Wiring WR_VDD is power supply wiring to which a predetermined power supply voltage VDD is applied. Wiring WR_GND is connected to a ground. The ground refers to a reference conducting portion having a potential of 0 V (zero volts) as a reference, or refers to the potential of 0 V itself. The reference conducting portion may be formed with use of a conductor such as metal. The wiring WR_GND is ground wiring to which a ground voltage is applied. The wiring WR_GND itself may be interpreted as the ground. The ground voltage has a potential of the ground, and is therefore 0 V. The power supply voltage VDD has a positive direct-current voltage value (for example, 5 V). The analog input signal Ain has a voltage value equal to or higher than 0 V and equal to or lower than the power supply voltage VDD.

The DAC 10 is a capacitor DAC (capacitor digital-to-analog converter). The capacitor DAC is referred to also as a capacitive DAC in general. The DAC 10 includes a capacitor array 11 and a switch array 12. The capacitor array 11 includes capacitors C[1] to C[N]. The switch array 12 includes switches S[1] to S[N].

The DAC 10 is further provided with one or more scaling capacitors and one or more potential fixing switches. In the first embodiment, the DAC 10 is provided with one scaling capacitor and one potential fixing switch. The DAC 10 provided with one scaling capacitor and one potential fixing switch will particularly be referred to as a DAC 10_1.

FIG. 2 illustrates a configuration of the DAC 10_1. Incidentally, in the present embodiment, "10" may be used as a reference sign referring to the DAC, or "10_1" may be used as the reference sign referring to the DAC. When it is desired to emphasize that the DAC is the DAC 10 provided with one scaling capacitor and one potential fixing switch, "10_1" in particular is used as a reference sign referring to the DAC. The DAC 10_1 includes a capacitor Cs as the scaling capacitor and a switch $S_F$ as the potential fixing switch, and also includes a capacitor array 11_1 as an example of the capacitor array 11 and a switch array 12_1 as an example of the switch array 12. In the DAC 10_1, N and M are integers satisfying "N>M≥1." In the following, suppose that "M≥2" and "N≥M+2" are satisfied.

The capacitor array 11_1 includes the capacitors C[1] to C[N]. The switch array 12_1 includes the switches S[1] to S[N]. In the DAC 10_1, respective first terminals of the capacitors C[M+1] to C[N] among the capacitors C[1] to C[N] are connected to comparison wiring WR1, and respective first terminals of the capacitors C[1] to C[M] are connected to target wiring WR_s. In the DAC 10_1, the scaling capacitor Cs is inserted in series between the wiring WR1 and the wiring WR_s. That is, in the DAC 10_1, a first terminal of the scaling capacitor Cs is connected to the comparison wiring WR1, and a second terminal of the scaling capacitor Cs is connected to the target wiring WR_s.

In the DAC 10_1, a first terminal of the switch $S_F$ is connected to the target wiring WR_s, and a second terminal of the switch $S_F$ is connected to the wiring WR_Ain. That is, the switch $S_F$ is directly inserted between the wiring WR_s and the wiring WR_Ain.

The capacitors C[1] to C[N] each have a first terminal and a second terminal and store a charge between the first terminal and the second terminal. The switches S[1] to S[N] are respectively provided to correspond to the capacitors C[1] to C[N]. That is, a switch S[i] is provided to correspond to a capacitor C[i]. In addition, the capacitor C[i] corresponds to the ith bit in the digital output signal Dout. The analog input signal Ain, the power supply voltage VDD, or the ground voltage can be applied to the second terminals of the capacitors C[1] to C[N] via the switches S[1] to S[N]. In addition, a voltage applied to the comparison wiring WR1 will be referred to as a comparison voltage V1.

Figure 3:
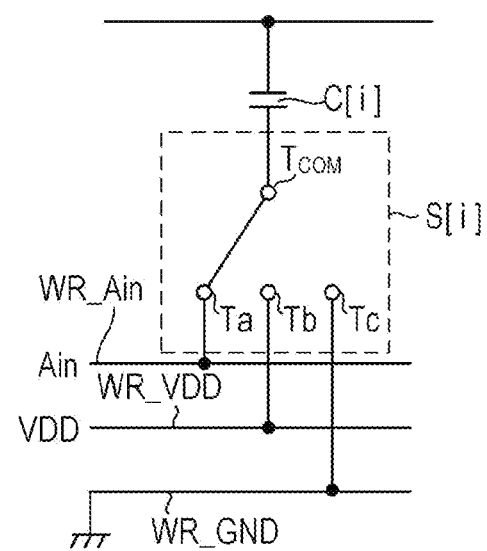
FIG. 3 relates to the first embodiment of the present disclosure, and is a diagram illustrating an internal configuration and a peripheral circuit of one switch in a switch array.

FIG. 3 illustrates connection relation between the capacitor C[i], the switch S[i], and the wiring WR_Ain, WR_VDD, and WR_GND. The switches S[1] to S[N] each have a common terminal $T_{COM}$ and switching terminals Ta, Tb, and Tc. The common terminals $T_{COM}$ of the switches S[1] to S[N] are respectively connected to the second terminals of the capacitors C[1] to C[N]. Specifically, for example, the common terminal $T_{COM}$ of the switch S[1] is connected to the second terminal of the capacitor C[1], and the common terminal $T_{COM}$ of the switch S[2] is connected to the second terminal of the capacitor C[2]. The same is true for the switch S[3] and other switches. The respective switching terminals Ta of the switches S[1] to S[N] are connected to the wiring WR_Ain, and receive the analog input signal Ain. The respective switching terminals Tb of the switches S[1] to S[N] are connected to the wiring WR_VDD, and receive the power supply voltage VDD. The respective switching terminals Tc of the switches S[1] to S[N] are connected to the wiring WR_GND, and receive the ground voltage.

Under control of the control circuit 30, in each of the switches S[1] to S[N], the common terminal $T_{COM}$ is selectively connected to one of the switching terminals Ta, Tb, and Tc. However, there may be cases where the common terminal $T_{COM}$ is not connected to any of the switching terminals Ta, Tb, and Tc in the switch S[i]. In addition, the switch $S_F$ is controlled to be in an on state or an off state by the control circuit 30. In the following, the on state and the off state may be represented simply as on and off, respectively. When the switch $S_F$ is on, there is conduction between the first terminal and the second terminal of the switch $S_F$. When the switch $S_F$ is off, there is an interruption (non-conduction) between the first terminal and the second terminal of the switch $S_F$. Incidentally, FIG. 1 and FIG. 2 illustrate, as an example, a state in which the switch $S_F$ is set in the off state.

Figure 4:
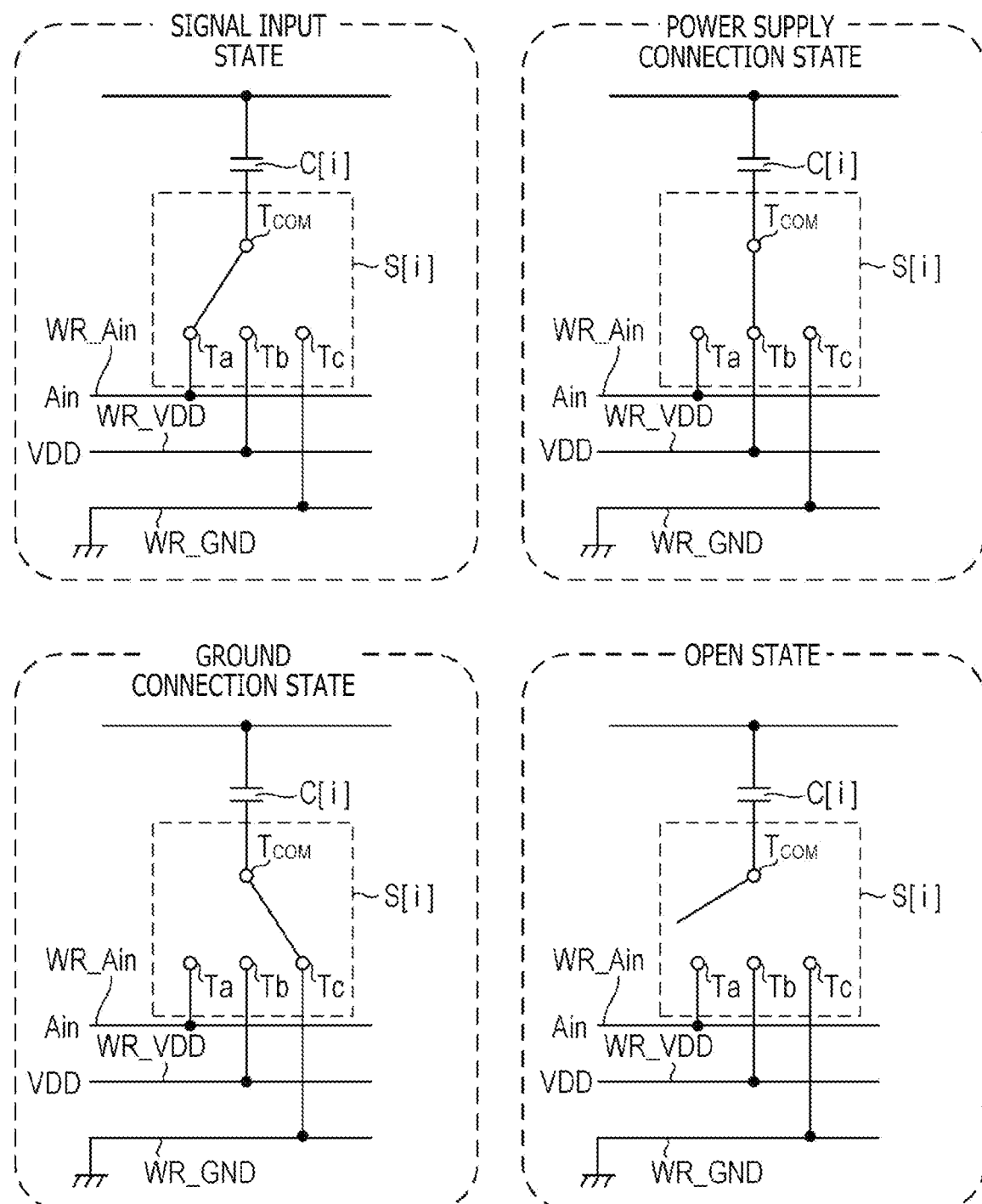
FIG. 4 relates to the first embodiment of the present disclosure, and is a diagram illustrating four states of one switch in the switch array.

With reference to FIG. 4, in the following, in a given switch S[i], states in which the common terminal $T_{COM}$ is connected to the switching terminals Ta, Tb, and Tc will be referred to as a signal input state, a power supply connection state, and a ground connection state, respectively, and a state in which the common terminal $T_{COM}$ is not connected to any of the switching terminals Ta, Tb, and Tc will be referred to as an open state. The analog input signal Ain, the power supply voltage VDD, and the ground voltage are applied to the second terminal of the capacitor C[i] in the signal input state, the power supply connection state, and the ground state, respectively, of the switch S[i]. Incidentally, FIG. 1 and FIG. 2 illustrate, as an example, a state in which the switches S[1] to S[N] are all set in the signal input state.

A reference will be made to FIG. 1 again. The switch $S_G$ is a short-circuiting switch. The switch $S_G$ is provided in series between the comparison wiring WR1 and the ground. That is, a first terminal of the switch $S_G$ is connected to the comparison wiring WR1, and a second terminal of the switch $S_G$ is connected to the ground (or in other words, connected to the wiring WR_GND). The switch $S_G$ is controlled to be on or off by the control circuit 30. When the switch $S_G$ is on, there is conduction between the first terminal and the second terminal of the switch $S_G$, and therefore, the voltage of the comparison wiring WR1 (that is, the comparison voltage V1) is fixed at 0 V. When the switch $S_G$ is off, there is an interruption (non-conduction) between the first terminal and the second terminal of the switch $S_G$, and therefore, the switch $S_G$ does not affect the comparison voltage V1. Incidentally, FIG. 1 illustrates, as an example, a state in which the switch $S_G$ is off.

Each of the switches S[1] to[N], $S_F$, and $S_G$ can be formed by a given switching element such as a MOSFET. The MOSFET is an abbreviated name of a "metal-oxide-semiconductor field-effect transistor." The switches S[1] to S[N] may be a multiplexer. Incidentally, with regard to a given switch, the control circuit 30 controlling the switch to be in a certain state of interest is synonymous with the control circuit 30 setting the state of the switch to be in the state of interest.

The comparator 20 is connected to the comparison wiring WR1 and comparison wiring WR2. As described above, the comparison voltage V1 is applied to the comparison wiring WR1. On the other hand, a comparison voltage V2 is applied to the comparison wiring WR2. The comparison voltage V2 in the present embodiment is the ground voltage. The comparator 20 compares the comparison voltages V1 and V2 with each other, and generates and outputs a comparison result signal $S_{CMP}$ indicating a result of the comparison (height relation) between the comparison voltages V1 and V2. The comparison result signal $S_{CMP}$ is a binarized signal having a value of "0" or "1." The comparator 20 has a non-inverting input terminal, an inverting input terminal, and an output terminal. Suppose here that the inverting input terminal is connected to the comparison wiring WR1 and that the non-inverting input terminal is connected to the comparison wiring WR2.

The comparator 20 outputs the comparison result signal $S_{CMP}$ having the value of "1" from the output terminal of the comparator 20 itself when "V1<V2" holds. The comparator 20 outputs the comparison result signal $S_{CMP}$ having the value of "0" from the output terminal of the comparator 20 itself when "V1>V2" holds. The comparison result signal $S_{CMP}$ has the value of "0" or "1" when "V1=V2" holds. "V1>V2" indicates that the comparison voltage V1 is higher than the comparison voltage V2. "V1<V2" indicates that the comparison voltage V1 is lower than the comparison voltage V2. The same is true for other expressions including physical quantities such as voltages.

The control circuit 30 receives the comparison result signal $S_{CMP}$. The control circuit 30 controls the AD conversion operation as a whole, and outputs the digital output signal Dout obtained by the AD conversion operation. The control circuit 30 is provided with a register 31. A value of the digital output signal Dout can be stored in the register 31. The control circuit 30 individually controls the states of the switches S[1] to S[N] by supplying a control signal $CNT_{DAC}$ (DAC input signal) to the DAC 10. In addition, the control circuit 30 controls the state of the switch S F by supplying a control signal $CNT_F$ to the DAC 10. The control circuit 30 further controls the state of the switch $S_G$ by supplying a control signal $CNT_G$ to the switch $S_G$.

Figure 5:
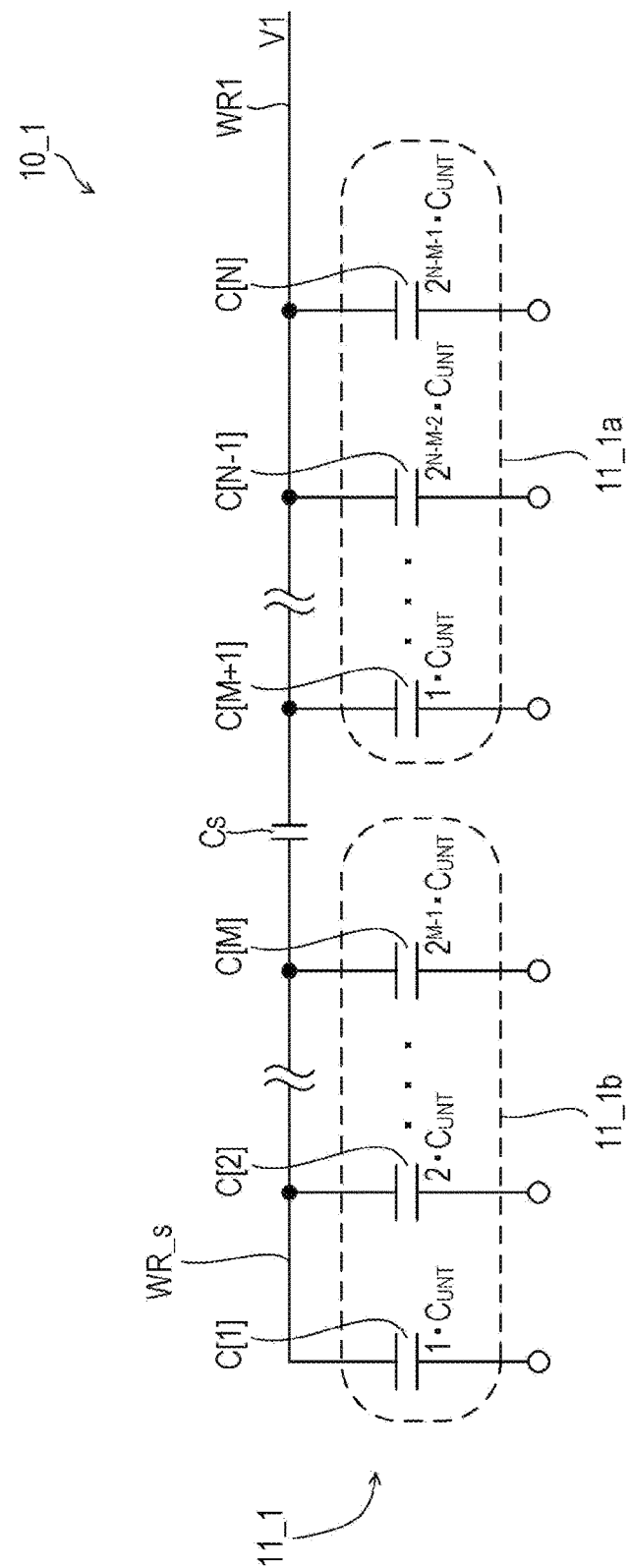
FIG. 5 relates to the first embodiment of the present disclosure, and is a diagram illustrating relation between capacitance values of a plurality of capacitors in a capacitor array.

FIG. 5 illustrates relation between capacitance values of the respective capacitors in the DAC 10_1. In the DAC 10_1, with regard to an integer i satisfying "1≤i≤M," the capacitor C[i] has a capacitance value of "$2^{i-1} \cdot C_{UNT}$." Hence, with regard to the integer i satisfying "1≤i≤M," a capacitance value of a capacitor C[i+1] is larger than the capacitance value of the capacitor C[i], and is specifically twice the capacitance value of the capacitor C[i]. $C_{UNT}$ denotes a predetermined unit capacitance value.

In the DAC 10_1, with regard to the integer i satisfying "M+1≤i≤N," the capacitor C[i] has a capacitance value of "$2^{i-M} \cdot C_{UNT}$." Hence, with regard to the integer i satisfying "M+1≤i≤N," the capacitance value of the capacitor C[i+1] is larger than the capacitance value of the capacitor C[i], and is specifically twice the capacitance value of the capacitor C[i].

In the DAC 10_1, a value of a combined capacitance of the capacitors C[1] to C[M] and the scaling capacitor Cs (that is, a capacitance value of a circuit formed by connecting a parallel connection circuit of the capacitors C[1] to C[M] and the scaling capacitor Cs in series with each other) is equal to the unit capacitance value $C_{UNT}$.

A capacitor array formed by a capacitor group connected to the comparison wiring (comparison wiring WR1 in this case) among the capacitors C[1] to C[N] in the DAC 10 will be referred to as a high order side local array. A capacitor array formed by a capacitor group connected to the target wiring (target wiring WR_s in this case) will be referred to as a low order side local array. In the DAC 10_1 provided with only one scaling capacitor Cs, there is only one low order side local array. That is, as illustrated in FIG. 5, the DAC 10_1 includes a high order side local array 11_1a formed by the capacitors C[M+1] to C[N] and a low order side local array 11_1b formed by the capacitors C[1] to C[M], and the local arrays 11_1a and 11_1b form the capacitor array 11_1.

Figure 6:
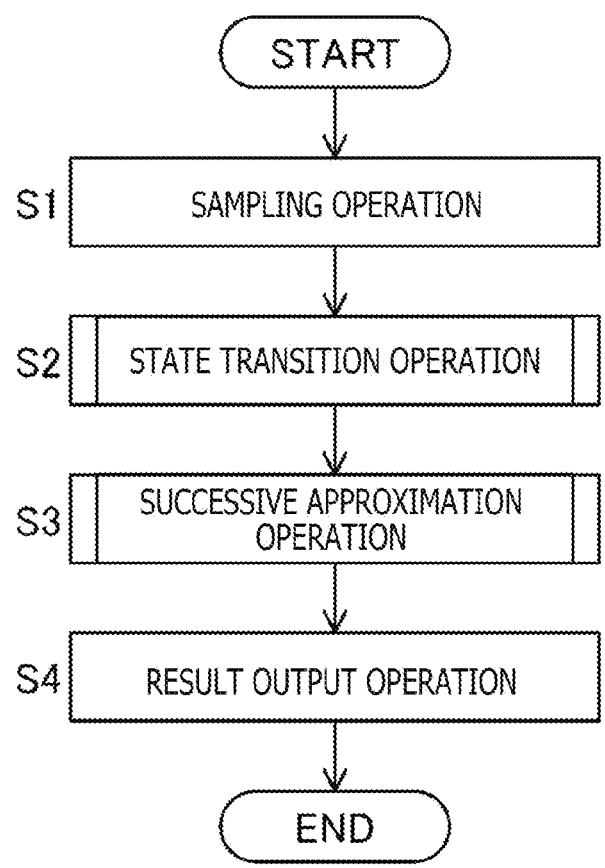
FIG. 6 relates to the first embodiment of the present disclosure, and is a flowchart of an AD conversion operation.

FIG. 6 illustrates a flowchart of the AD conversion operation. The AD conversion operation first performs a sampling operation in step S1, next performs a state transition operation in step S2, then performs a successive approximation operation in step S3, and finally performs a result output operation in step S4. In the following, a period in which the sampling operation is performed will be referred to as a sampling period, and a period in which the successive approximation operation is performed will be referred to as a successive approximation period.

Figure 7:
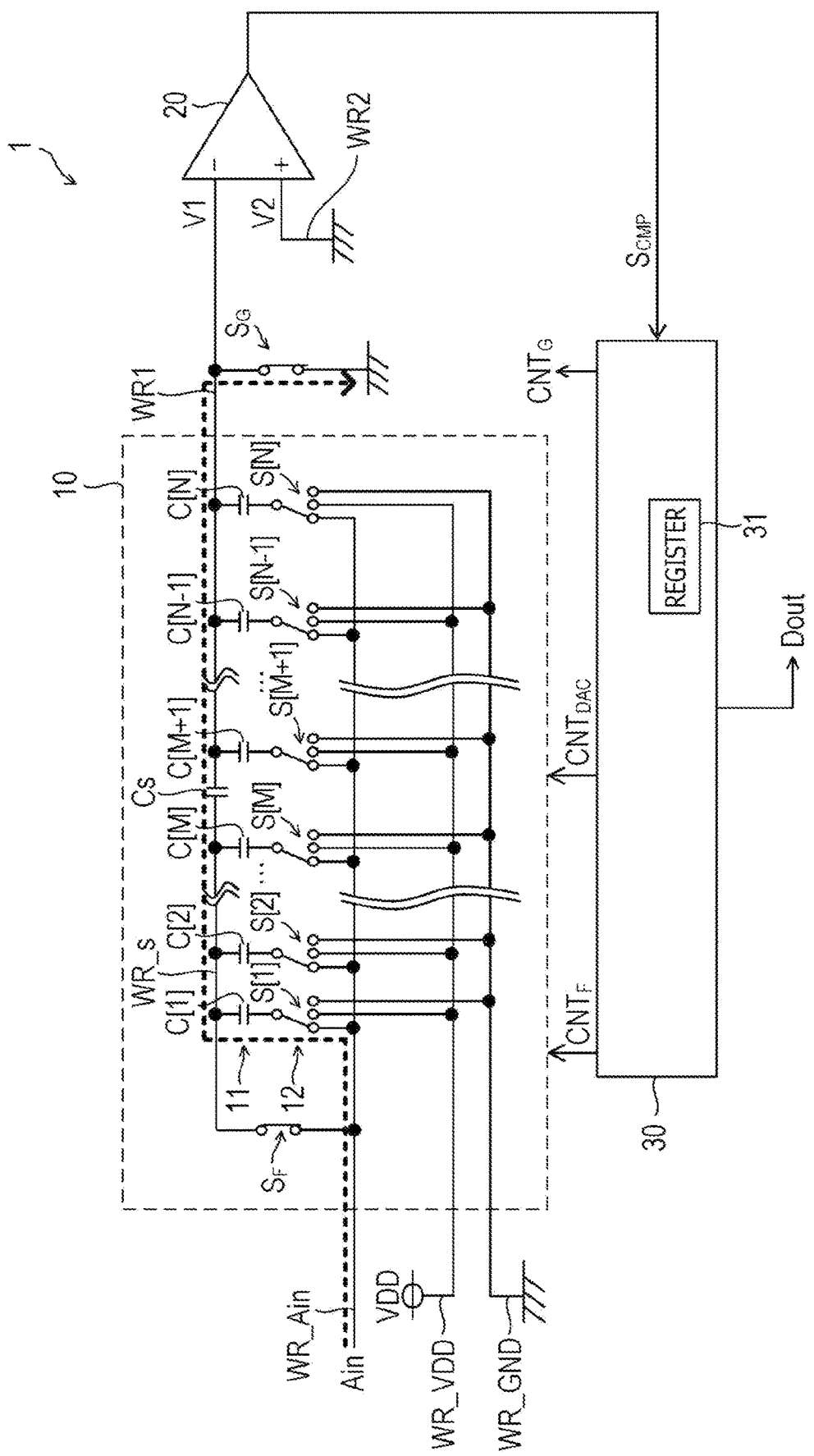
FIG. 7 relates to the first embodiment of the present disclosure, and is a diagram illustrating a state of the AD converter when a sampling operation is performed.

FIG. 7 illustrates a state of the AD converter 1 in the sampling period. The sampling period has a predetermined time length. In the sampling period, the control circuit 30 controls all of the switches S[1] to S[N] in the DAC 10 to be in the signal input state, and controls the switches $S_F$ and $S_G$ to be on. Incidentally, the operation of the comparator 20 may be stopped in the sampling period.

In the sampling period, the wiring WR_Ain is connected to the capacitor array 11 via the switch array 12. Consequently, a charge corresponding to the analog input signal Ain is stored in each capacitor in the capacitor array 11, and is also stored in the scaling capacitor Cs. In the sampling period, the comparison wiring WR1 is connected to the ground via the switch $S_G$. Thus, each capacitor in the capacitor array 11 is charged by the analog input signal Ain with the ground voltage as a reference (and the scaling capacitor Cs is also similarly charged).

In addition, in the sampling period, the switch $S_F$ is on, and therefore, the target wiring WR_s is connected to the wiring WR_Ain via the switch $S_F$. As a result, a potential of the target wiring WR_s is fixed at a potential of the analog input signal Ain in the sampling period. Therefore, the capacitors (capacitors C[1] to C[M] in this case) having the first terminals thereof connected to the target wiring (target wiring WR_s in this case) in the capacitor array 11 do not store charges nor are charged in the sampling period (the same is true for other embodiments to be described later).

Figure 8:
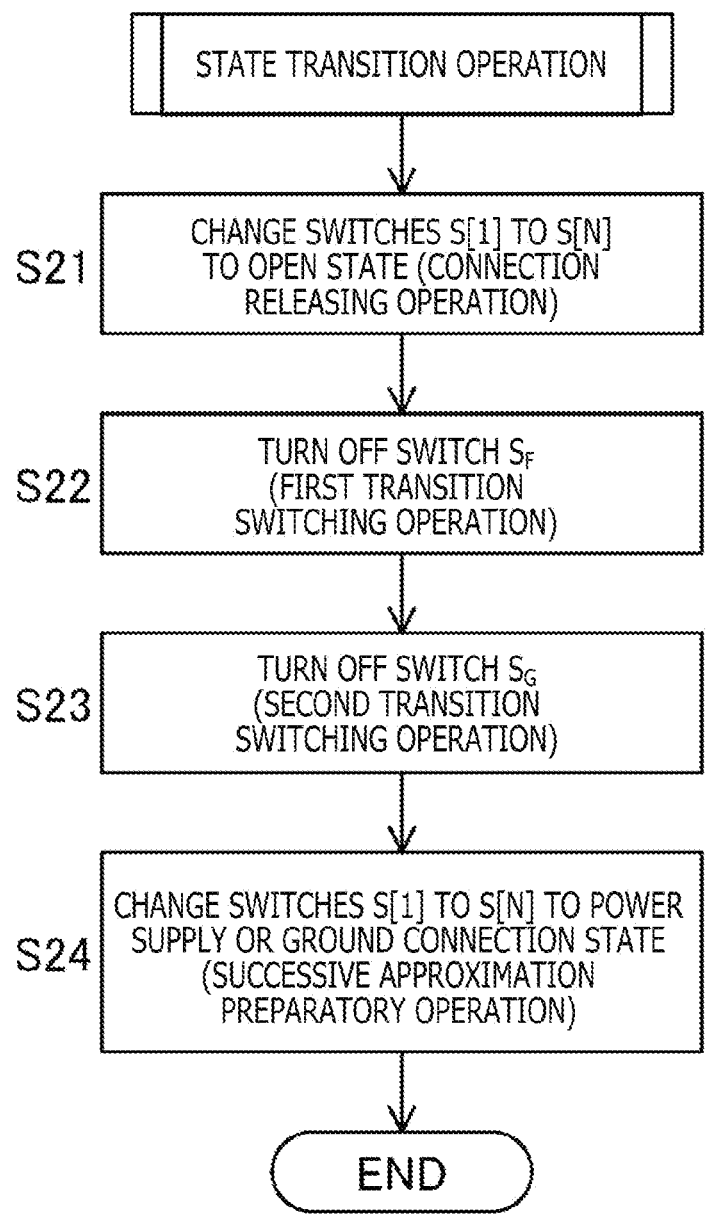
FIG. 8 relates to the first embodiment of the present disclosure, and is a flowchart of a state transition operation.

FIG. 8 illustrates an example of a flow of the state transition operation in step S2. In the example of FIG. 8, the state transition operation performs operations of steps S21, S22, S23, and S24 in this order. The operations of steps S21, S22, S23, and S24 will be referred to as a connection releasing operation, a first transition switching operation, a second transition switching operation, and a successive approximation preparatory operation, respectively.

In the connection releasing operation of step S21, the states of the switches S[1] to S[N] of the DAC 10 are all switched from the signal input state to the open state. In the first transition switching operation of step S22, the state of the switch $S_F$ is switched from on to off. After step S22, the switch $S_F$ is maintained in the off state until completion of the successive approximation operation of step S3. In the second transition switching operation of step S23, the state of the switch $S_G$ is switched from on to off. After step S23, the switch $S_G$ is maintained in the off state until completion of the successive approximation operation of step S3. In the successive approximation preparatory operation of step S24, the states of the switches S[1] to S[N] of the DAC 10 are switched to the power supply connection state or the ground connection state. Incidentally, the operation contents of step S22 and the operation contents of step S23 may be reversed. That is, the switch $S_G$ may be switched from on to off in step S22, and the switch $S_F$ may be switched from on to off in step S23.

Figure 9:
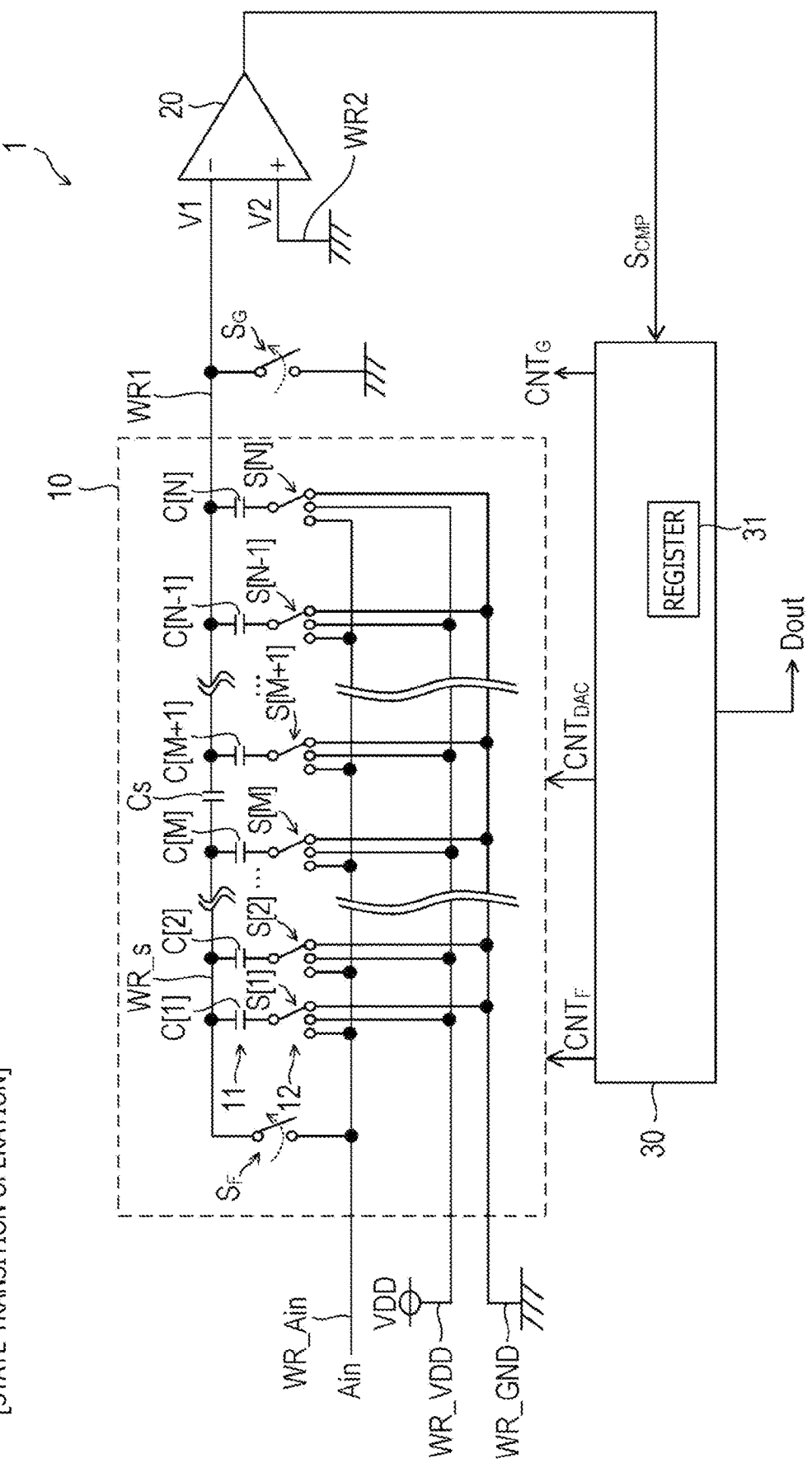
FIG. 9 relates to the first embodiment of the present disclosure, and is a diagram illustrating a state of the AD converter in relation to a successive transition operation.

FIG. 9 illustrates a state of the AD converter 1 that has undergone the operations of steps S21 to S24. The example of FIG. 9 assumes that the states of the switches S[1] to S[N] of the DAC 10 are all switched to the ground connection state in step S24.

The transition timings of the respective states of the switches S[1] to S[N], $S_F$, and $S_G$ in the state transition operation can be changed variously.

Specifically, for example, in the state transition operation, the operations of steps S21, S22, and S23 may be performed simultaneously, and the operation of step S24 may thereafter be performed.

Alternatively, in the state transition operation, the operations of steps S21 and S22 may first be performed simultaneously, the operation of step S23 may then be performed, and the operation of step S24 may thereafter be performed. Alternatively, the operations of steps S21 and S22 may first be performed simultaneously, and then the operations of step S23 and step S24 may be performed simultaneously.

Alternatively, in the state transition operation, the operation of step S21 may first be performed, the operations of steps S22 and S23 may then be performed simultaneously, and the operation of step S24 may thereafter be performed. Alternatively, the operation of step S21 may first be performed, the operation of step S22 may then be performed, and the operations of steps S23 and S24 may thereafter be performed simultaneously. Alternatively, in the state transition operation, the operation of step S21 may first be performed, and then the operations of steps S22, S23, and S24 may be performed simultaneously.

In step S24, the switches S[1] to S[N] can be all set in the ground connection state or all set in the power supply connection state. Alternatively, in step S24, the states of the switches S[1] to S[N] may be set in an initial state (the state of step S32 at "j=N" to be described later: see FIG. 10) of the switches S[1] to S[N] in the successive approximation operation of step S3. The operation of step S24 can be omitted.

Figure 10:
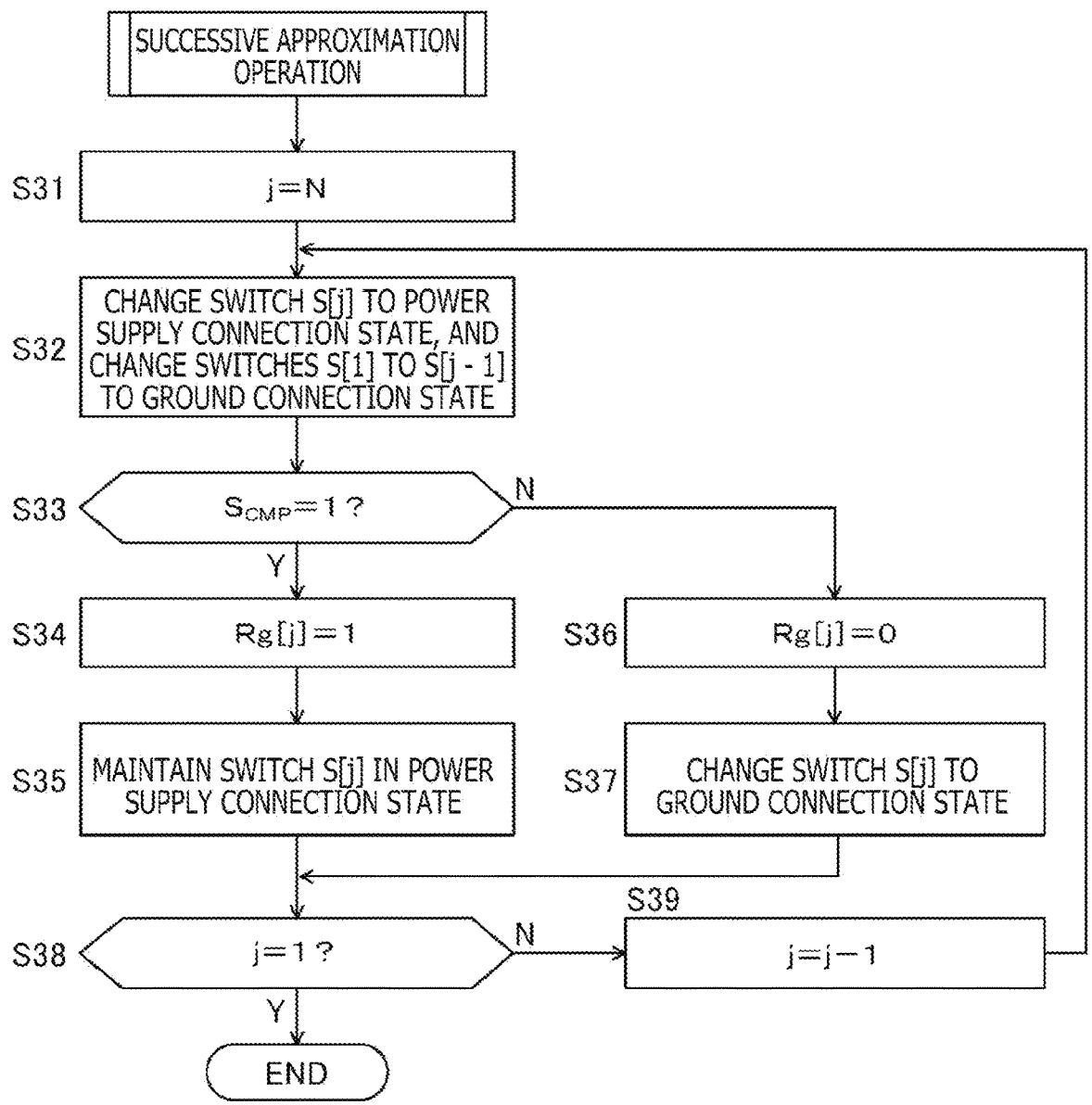
FIG. 10 relates to the first embodiment of the present disclosure, and is a flowchart of a successive approximation operation.

FIG. 10 illustrates a flowchart of the successive approximation operation of step S3. As is understood from the above description, the switches $S_F$ and $S_G$ are maintained in the off state in the successive approximation period in which the successive approximation operation is performed. In the successive approximation period according to the present embodiment, the comparison voltage V1 has a positive or negative voltage value or is 0 V, and the comparator 20 compares the comparison voltage V1 with the comparison voltage V2 of 0 V. Therefore, the comparator 20 is supplied with a positive power supply voltage and a negative power supply voltage. The positive power supply voltage may be the power supply voltage VDD. The negative power supply voltage has a voltage value of (−VDD), for example.

Figure 11:
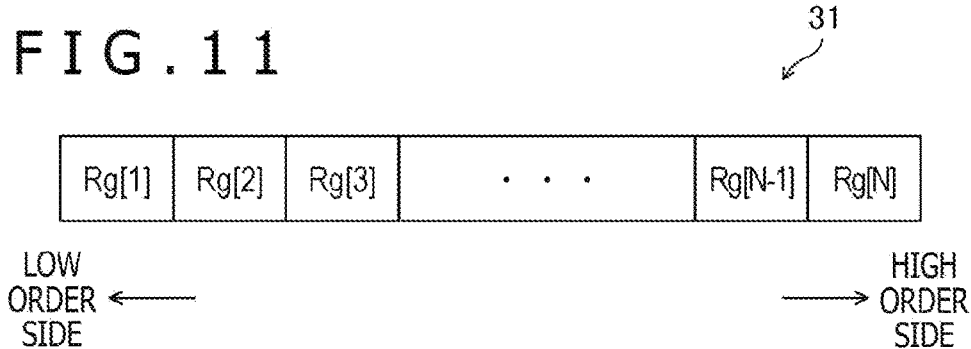
FIG. 11 relates to the first embodiment of the present disclosure, and is a configuration diagram of a register in a control circuit.

FIG. 11 illustrates a structure of the register 31 (see FIG. 1). The register 31 has a storage capacity for N bits, and stores values Rg[1] to Rg[N]. The values Rg[1] to Rg[N] are each "0" or "1." With regard to a given integer i, a value Rg[i+1] is a value of a high order side bit of a value Rg[i]. The values Rg[1] to Rg[N] are determined on a bit-by-bit basis from a high order bit side in the successive approximation operation. The determined value Rg[i] is a value of the ith bit in the digital output signal Dout.

In the successive approximation period, the switches S[1] to S[N] are individually set in the power supply connection state or the ground connection state. A charge stored in the DAC 10 (in the capacitor array 11) in the sampling period is distributed to the capacitors C[1] to C[N] in the successive approximation period. A state of the distribution depends on the states of the switches S[1] to S[N] in the successive approximation period. Therefore, the comparison voltage V1 changes depending on the states of the switches S[1] to S[N] in the successive approximation period. In the successive approximation operation (in other words, in the successive approximation period), the control circuit 30 determines the values Rg[1] to Rg[N] (that is, the value of the digital output signal Dout) on a bit-by-bit basis while sequentially changing the state of the switch array 12 by a binary search on the basis of the comparison result signal $S_{CMP}$.

Figure 12:
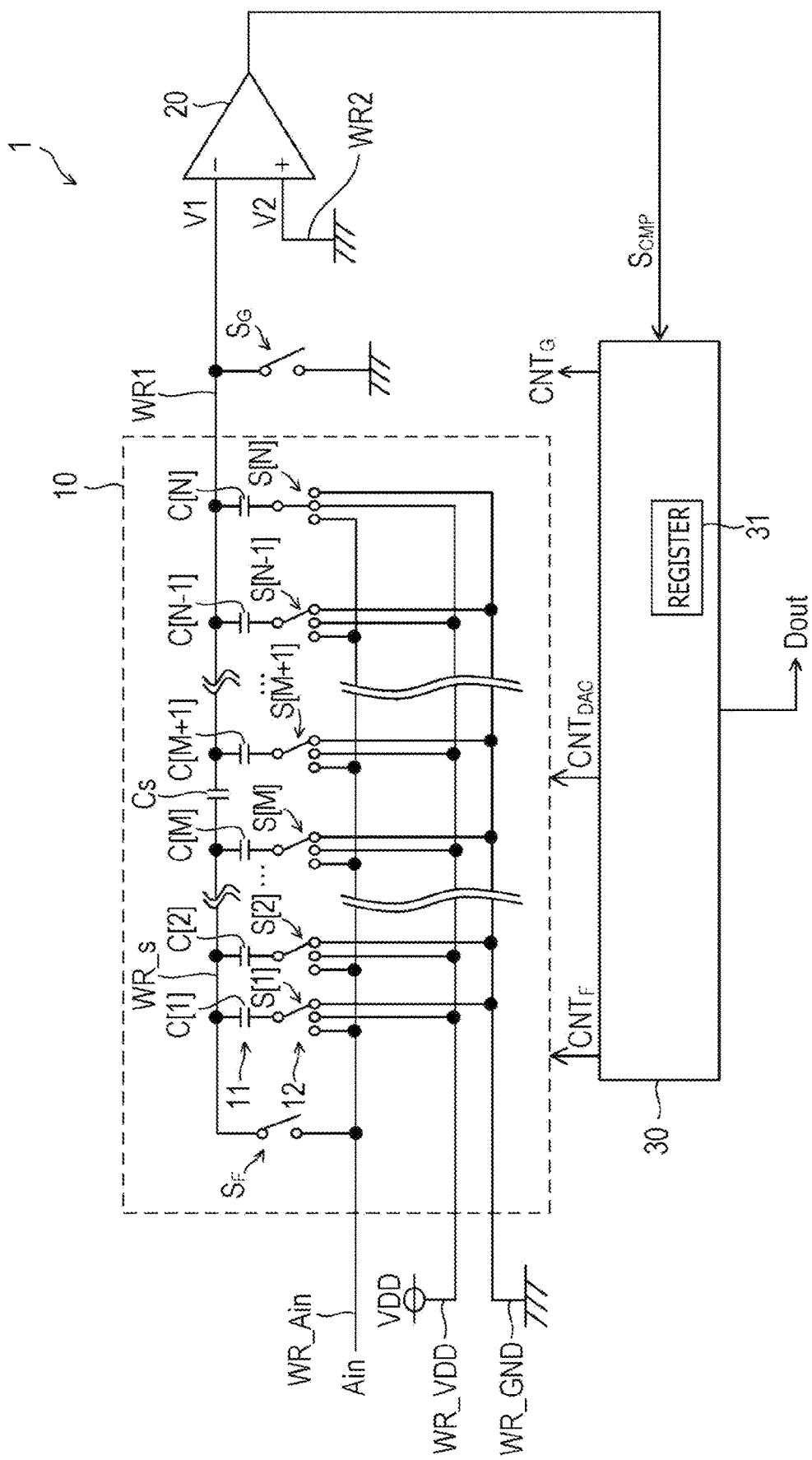
FIG. 12 relates to the first embodiment of the present disclosure, and is a diagram illustrating a state of the AD converter when the successive approximation operation is performed.

In the successive approximation operation of FIG. first, step S31 assigns a value of N to a variable j managed by the control circuit 30. The operation then proceeds to step S32. In step S32, the control circuit 30 controls the switch S[j] to be in the power supply connection state, and controls all of the switches S[1] to S[j−1] to be in the ground connection state. However, when the processing of step S32 is performed in a state of "j=1," the switches S[1] to S[j−1] do not exist, and therefore, step S32 simply controls the switch S[1] to be in the power supply connection state. As an example, FIG. 12 illustrates the state of each switch in step S32 when "j=N."

In step S33 following step S32, the control circuit obtains the value of the comparison result signal $S_{CMP}$ at a present time (that is, obtains the value of the comparison result signal $S_{CMP}$ output from the comparator 20 in the state of the immediately preceding step S32). When the obtained value is "1" (Y in step S33), the operation proceeds to step S34, and the control circuit 30 performs the processing of steps S34 and S35. When the obtained value is "0" (N in step S33), on the other hand, the operation proceeds to step S36, and the control circuit 30 performs the processing of steps S36 and S37.

In step S34, the control circuit 30 determines the value Rg[j] as "1." In the following step S35, the control circuit 30 maintains the switch S[j] in the power supply connection state. The switch S[j] is thereafter maintained in the power supply connection state until the successive approximation operation of FIG. 10 is ended. After step S35, the operation proceeds to step S38. Since nothing is practically performed in step S35, step S35 may be omitted.

In step S36, the control circuit 30 determines the value Rg[j] as "0." In the following step S37, the control circuit 30 switches the state of the switch S[j] from the power supply connection state to the ground connection state. The switch S[j] is thereafter maintained in the ground connection state until the successive approximation operation of FIG. 10 is ended. After step S37, the operation proceeds to step S38.

In step S38, the control circuit 30 checks whether the variable j is 1. When the variable j is not 1 (N in step S38), the operation proceeds to step S39, and subtracts 1 from the variable j. The operation then returns to step S32 to repeat step S32 and the subsequent processing. For example, in the processing of step S32 of a second time, the switch S[N−1] is set in the power supply connection state, and the switches S[1] to S[N−2] are set in the ground connection state. At this time, when "$S_{CMP}=1$" in step S33 of the first time, the switch S[N] is set in the power supply connection state in step S32 of the second time, or when "$S_{CMP}=0$" in step S33 of the first time, the switch S[N] is set in the ground connection state in step S32 of the second time.

The processing of steps S32 to S37 will be referred to as a unit comparison operation. Then, the successive approximation operation includes a first unit comparison operation to an Nth unit comparison operation. The unit comparison operation performed when "j=N" is the Nth unit comparison operation, the unit comparison operation performed when "j=N−1" is the (N−1)th unit comparison operation, . . . , and the unit comparison operation performed when "j=1" is the first unit comparison operation. In the jth unit comparison operation, the value Rg[j] is determined, that is, a value of the jth bit of the digital output signal Dout is determined.

When "j=1" in step S38 (Y in step S38), the successive approximation operation of FIG. 10 is ended. In this stage, the values Rg[1] to Rg[N] are all determined.

In the result output operation of step S4 (see FIG. 6), the control circuit 30 outputs, as the digital output signal Dout, a digital signal having the values Rg[1] to Rg[N] determined in the successive approximation operation of step S3. The digital output signal Dout is output to a given circuit (not illustrated) that uses the digital output signal Dout.

Figure 13:
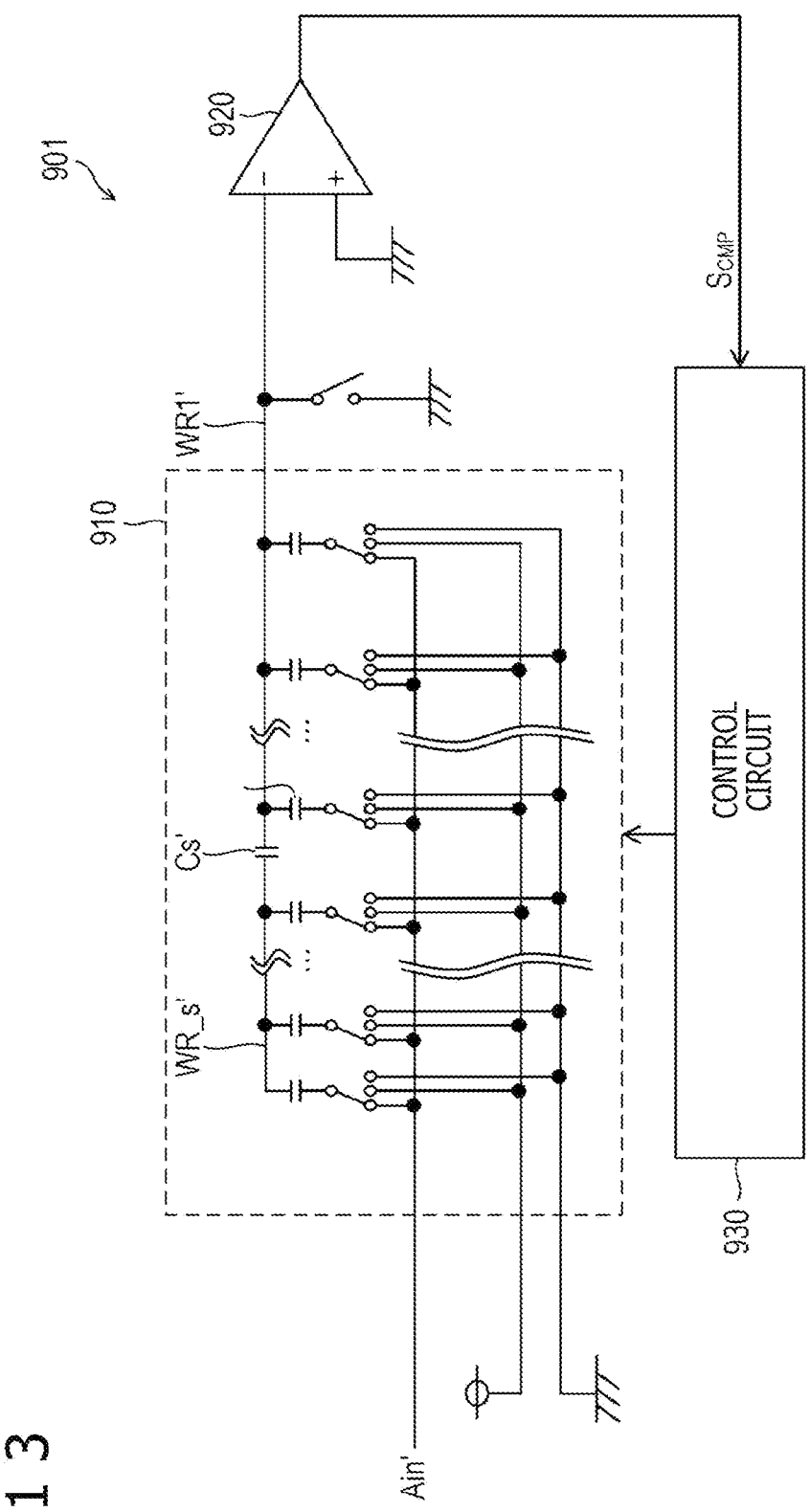
FIG. 13 is a configuration diagram of a reference AD converter.

In the capacitor array of the capacitor DAC, a scaling capacitor is typically used in order to reduce a capacitance ratio between a capacitor having a maximum capacitance value and a capacitor having a minimum capacitance value. FIG. 13 illustrates a configuration of a reference AD converter 901 provided for comparison with the AD converter 1. The reference AD converter 901 includes a capacitor DAC 910 having a scaling capacitor Cs', a comparator 920, and a control circuit 930. The reference AD converter 901 converts an analog input signal Ain' into a digital signal. The scaling capacitor Cs' is inserted in series between wiring WR1' connected to the comparator 920 and wiring WR_s'.

The reference AD converter 901 is not provided with a switch corresponding to the switch S F in FIG. 1. Therefore, in the reference AD converter 901, a potential of the wiring WR_s' is indeterminate at a time of sampling the analog input signal Ain'. The indeterminate potential in the wiring WR_s' leads to a decrease in AD conversion accuracy. Therefore, the reference AD converter 901 necessitates an initializing operation (initializing sequence) before the sampling. In the initializing operation, a voltage across the scaling capacitor Cs' is set at zero by short-circuiting both terminals of the scaling capacitor Cs'. The initializing operation needs to be performed each time the sampling is performed. The need for the initializing operation consequently leads to a decrease in a maximum sampling rate.

On the other hand, the AD converter 1 of FIG. 1 is provided with the potential fixing switch $S_F$, and therefore, the potential of the target wiring WR_s corresponding to the wiring WR_s' can be fixed at a time of sampling. The need for the initializing operation can therefore be obviated. An improvement in the maximum sampling rate is made possible by obviating the need for the initializing operation.

Second Embodiment

A second embodiment of the present disclosure will be described. The second embodiment and third and fourth embodiments to be described later are embodiments based on the first embodiment. As for items not particularly described in the second to fourth embodiments, description in the first embodiment is applied also to the second to fourth embodiments as long as there is no contradiction. However, in interpreting the description of the second embodiment, the description of the second embodiment may be given priority with regard to items contradicting between the first and second embodiments (the same is true for the third and fourth embodiments to be described later). A plurality of given embodiments among the first to fourth embodiments may be combined with each other as long as there is no contradiction.

The second embodiment includes the following examples EX2_1 to EX2_3. Items described in a given example among the examples EX2_1 to EX2_3 can be applied to another given example (that is, two or more given examples among the plurality of examples can be combined with each other) as long as there is no contradiction.

Example EX2_1

The example EX2_1 will be described. FIG. 14 illustrates a general configuration of an AD converter 1 according to the example EX2_1. The AD converter 1 according to the example EX2_1 has a configuration obtained by adding a reference voltage source 40 to the AD converter 1 of FIG. 1 (that is, the AD converter 1 according to the first embodiment). The reference voltage source 40 generates and outputs a reference voltage $V_{REF}$ as a predetermined positive direct-current voltage.

In the AD converter 1 according to the example EX2_1, the first terminal of the switch $S_G$ is connected to the comparison wiring WR1, while the second terminal of the switch $S_G$ is connected to the reference voltage source 40 to receive the reference voltage $V_{REF}$. Therefore, when the switch $S_G$ is on, the voltage of the comparison wiring WR1 is fixed at the reference voltage V REF. That is, in the AD converter 1 according to the example EX2_1, when the switch $S_G$ is turned on in the sampling period, each capacitor in the capacitor array 11 is charged by the analog input signal Ain with the reference voltage $V_{REF}$ as a reference (and the scaling capacitor Cs is also similarly charged).

In addition, in the AD converter 1 according to the example EX2_1, the comparison voltage V2 applied to the comparison wiring WR2 has a predetermined positive direct-current voltage value. Therefore, the example EX2_1 does not need the negative power supply voltage for the comparator 20. That is, the comparator 20 can be driven with use of only the positive power supply voltage with the ground voltage as a reference. Except for the addition of the reference voltage source 40 and the above-described contents involved in the addition of the reference voltage source 40, the configuration and operation of the AD converter 1 according to the example EX2_1 are identical to the configuration and operation of the AD converter 1 according to the first embodiment.

Example EX2_2

Figure 15:
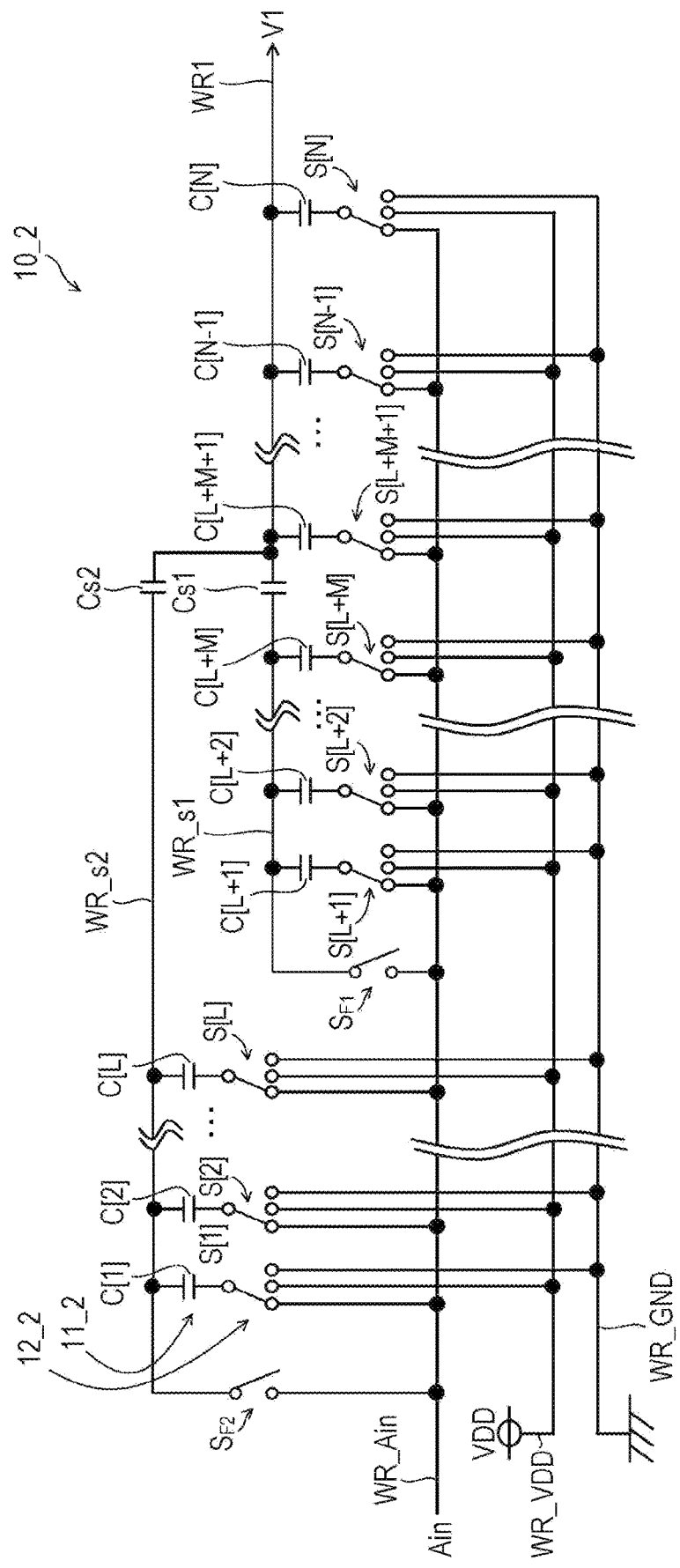
FIG. 15 relates to an example EX2_2 belonging to the second embodiment of the present disclosure, and is a configuration diagram of a DAC.

The example EX2_2 will be described. The number of scaling capacitors Cs provided to the DAC 10 (the number of serial stages) may be any number as long as the number is one or more. As an example, FIG. 15 illustrates a DAC 10_2 as the DAC 10 provided with two scaling capacitors Cs. The two scaling capacitors Cs in the DAC 10_2 will be referred to as scaling capacitors Cs1 and Cs2.

In addition to the scaling capacitors Cs1 and Cs2, the DAC 10_2 includes a capacitor array 11_2 as an example of the capacitor array 11 and a switch array 12_2 as an example of the switch array 12, and further includes switches $S_{F1}$ and $S_{F2}$ as two potential fixing switches. In the DAC 10_2, N, M, and L are integers satisfying "N>L+M," "L≥1," and "M≥1." Suppose here that "L≥2," "M≥2," and "N≥L+M+2" are satisfied.

As with the capacitor array 11 according to the first embodiment, the capacitor array 11_2 includes capacitors C[1] to C[N]. As with the switch array 12 according to the first embodiment, the switch array 12_2 includes switches S[1] to S[N].

In the DAC 10_2, the respective first terminals of the capacitors C[1] to C[L] among the capacitors C[1] to C[N] are connected to target wiring WR_s2 instead of the comparison wiring WR1, and the respective first terminals of the capacitors C[L+1] to C[L+M] are connected to target wiring WR_s1 instead of the comparison wiring WR1. As in the first embodiment, the respective first terminals of the capacitors C[L+M+1] to C[N] are connected to the comparison wiring WR1. As in the first embodiment, the second terminals of the capacitors C[1] to C[L] are connected to the common terminals $T_{COM}$ of the switches S[1] to S[L], respectively, the second terminals of the capacitors C[L+1] to C[L+M] are connected to the common terminals $T_{COM}$ of the switches S[L+1] to S[L+M], respectively, and the second terminals of the capacitors C[L+M+1] to C[N] are connected to the common terminals $T_{COM}$ of the switches S[L+M+1] to S[N], respectively (see FIG. 3).

In the DAC 10_2, the scaling capacitor Cs1 is inserted in series between the comparison wiring WR1 and the target wiring WR_s1. That is, in the DAC 10_2, a first terminal of the scaling capacitor Cs1 is connected to the comparison wiring WR1, and a second terminal of the scaling capacitor Cs1 is connected to the target wiring WR_s1. In the DAC 10_2, the scaling capacitor Cs2 is inserted in series between the comparison wiring WR1 and the target wiring WR_s2. That is, in the DAC 10_2, a first terminal of the scaling capacitor Cs2 is connected to the comparison wiring WR1, and a second terminal of the scaling capacitor Cs2 is connected to the target wiring WR_s2.

A first terminal of the switch $S_{F1}$ is connected to the target wiring WR_s1. A first terminal of the switch $S_{F2}$ is connected to the target wiring WR_s2. Respective second terminals of the switches $S_{F1}$ and $S_{F2}$ are connected to the wiring WR_Ain.

Figure 16:
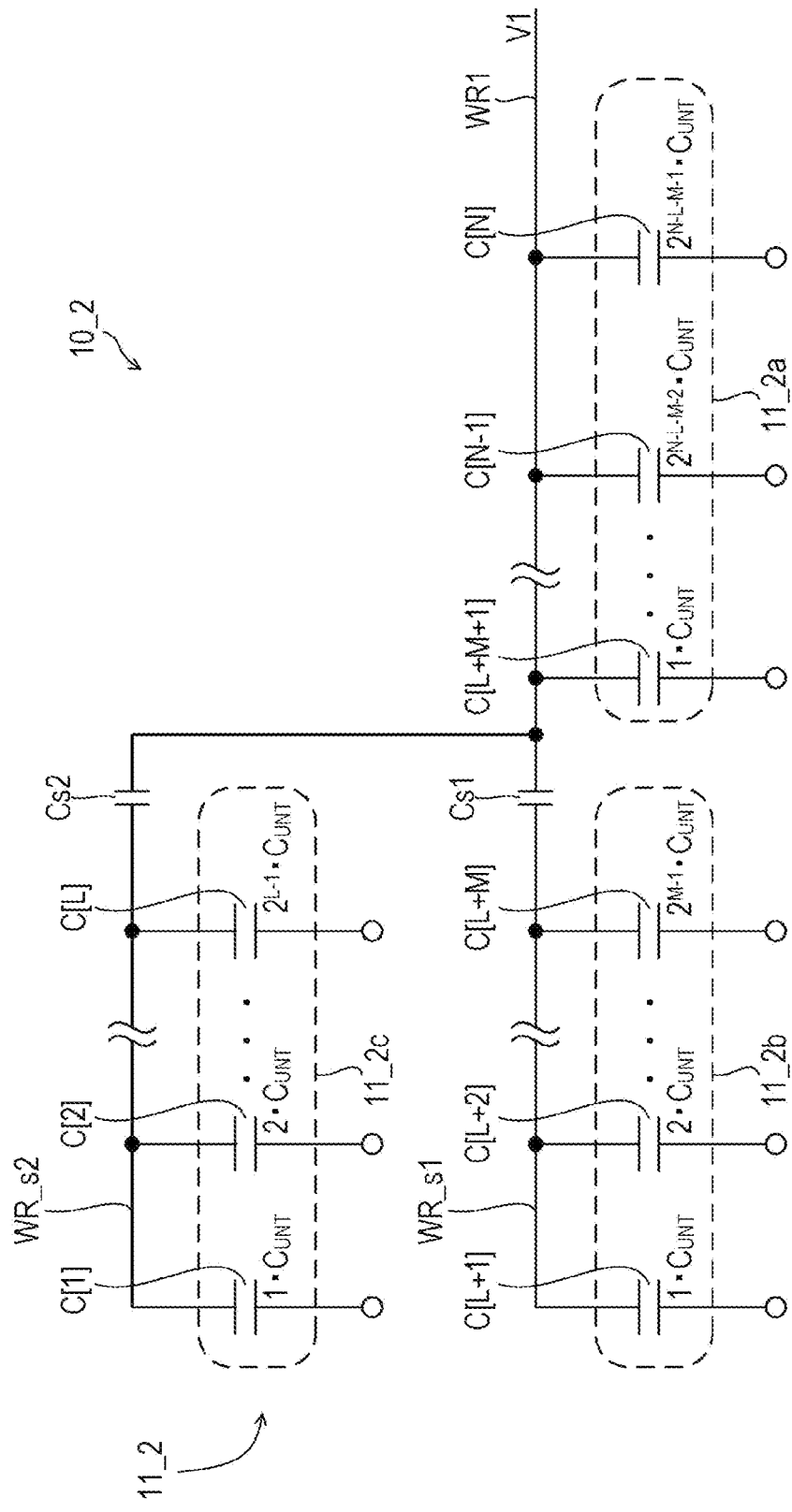
FIG. 16 is a diagram illustrating relation between capacitance values of a plurality of capacitors in a capacitor array in FIG. 15.

With reference to FIG. 16, in the DAC 10_2, with regard to the integer i satisfying "1≤i≤L," the capacitor C[i] has a capacitance value of "$2^{i-1} \cdot C_{UNT}$." In the DAC 10_2, with regard to the integer i satisfying "L+1≤i≤L+M," the capacitor C[i] has a capacitance value of "$2^{i-L-1} \cdot C_{UNT}$." In the DAC 10_2, with regard to the integer i satisfying "L+M+1≤i≤N," the capacitor C[i] has a capacitance value of "$2^{i-L-M-1} \cdot C_{UNT}$." In the DAC 10_2, a value of a combined capacitance of the capacitors C[1] to C[L+M] and the scaling capacitors Cs1 and Cs2 is equal to the unit capacitance value $C_{UNT}$. In addition, the scaling capacitor Cs2 has a higher capacitance value than the scaling capacitor Cs1.

Otherwise, the configuration and operation of the AD converter 1 having the DAC 10_2 are similar to those of the AD converter 1 according to the first embodiment, and the description of the first embodiment is applied also to the AD converter 1 having the DAC 10_2. However, at a time of this application, the switch $S_F$ in the first embodiment is read as the switches $S_{F1}$ and $S_{F2}$. Specifically, when the switch $S_F$ is turned on in the first embodiment, the switches $S_{F1}$ and $S_{F2}$ are turned on in the AD converter 1 having the DAC 10_2, and when the switch $S_F$ is turned off in the first embodiment, the switches $S_{F1}$ and $S_{F2}$ are turned off in the AD converter 1 having the DAC 10_2. Hence, in the AD converter 1 having the DAC 10_2, a potential of the target wiring WR_s1 and WR_s2 is fixed at the potential of the analog input signal Ain by turning on the switches $S_{F1}$ and $S_{F2}$ in the sampling period, and the switches $S_{F1}$ and $S_{F2}$ are maintained in the off state in the successive approximation period.

Incidentally, as described above, a capacitor array formed by a capacitor group connected to the comparison wiring (comparison wiring WR1 in this case) among the capacitors C[1] to C[N] in the DAC 10 will be referred to as a high order side local array. A capacitor array formed by a capacitor group connected to the target wiring (target wiring WR_s1 and WR_s2 in this case) will be referred to as a low order side local array. In the DAC 10_2 provided with the two scaling capacitors Cs, there are two low order side local arrays. That is, as illustrated in FIG. 16, the DAC 10_2 includes a high order side local array 11_2a formed by the capacitors C[L+M+1] to C[N], a low order side local array 11_2b formed by the capacitors C[L+1] to C[L+M], and a low order side local array 11_2c formed by the capacitors C[1] to C[L]. The local arrays 11_2a, 11_2b, and 11_2c form the capacitor array 11_2. The low order side local array 11_2b may be referred to as an intermediate local array.

Example EX2_3

The example EX2_3 will be described. Configurations of the switches $S_F$ and $S_G$ will be described. The description of the configuration of the switch S F described in the following is applied also to the switches $S_{F1}$ and $S_{F2}$ (see FIG. 15).

The switches $S_F$ and $S_G$ are constituted by a switching element based on a semiconductor. Here, the size of the switch $S_F$ may be smaller than the size of the switch $S_G$. For example, the size of the switch $S_F$ may be ½ or less of the size of the switch $S_G$. This is because, while currents flow via the switches $S_F$ and $S_G$ in the sampling period, a total amount and a peak value of the current flowing via the switch $S_F$ in the sampling period are expected to be smaller than a total amount and a peak value of the current flowing via the switch $S_G$.

In the DAC 10_1 of FIG. 2, a sum total of the capacitance values of the capacitors C[1] to C[M] connected to the target wiring WR_s in the capacitor array 11_1 may be lower than a sum total of the capacitance values of the capacitors C[M+1] to C[N] connected to the comparison wiring WR1. In this case, the total amount and the peak value of the current flowing via the switch $S_F$ in the sampling period are smaller than the total amount and the peak value of the current flowing via the switch $S_G$.

In the DAC 10_2 of FIG. 15, a sum total of capacitance values of the capacitors C[L+1] to C[L+M] connected to the target wiring WR_s1 in the capacitor array 11_2 may be smaller than a sum total of capacitance values of the capacitors C[L+M+1] to C[N] connected to the comparison wiring WR1. In this case, the total amount and the peak value of the current flowing via switch $S_{F1}$ in the sampling period are smaller than the total amount and the peak value of the current flowing via the switch $S_G$. Similarly, a sum total of capacitance values of the capacitors C[1] to C[L] connected to the target wiring WR_s2 in the capacitor array 11_2 (see FIG. 16) may be smaller than a sum total of the capacitance values of the capacitors C[L+M+1] to C[N] connected to the comparison wiring WR1. In this case, the total amount and the peak value of the current flowing via switch $S_{F2}$ in the sampling period are smaller than the total amount and the peak value of the current flowing via the switch $S_G$.

The switch $S_F$ can be constituted by one or more MOSFETs. When the switch $S_F$ is turned on, the current through the switch $S_F$ flows from the wiring WR_Ain to the target wiring (WR_s, WR_s1, WR_s2). Therefore, the switch $S_F$ can be constituted only by an N-channel MOSFET. However, the switch $S_F$ may be constituted only by a P-channel MOSFET, or a bidirectional analog switch constituted by an N-channel MOSFET and a P-channel MOSFET may be used as the switch $S_F$.

Third Embodiment

Figure 17:
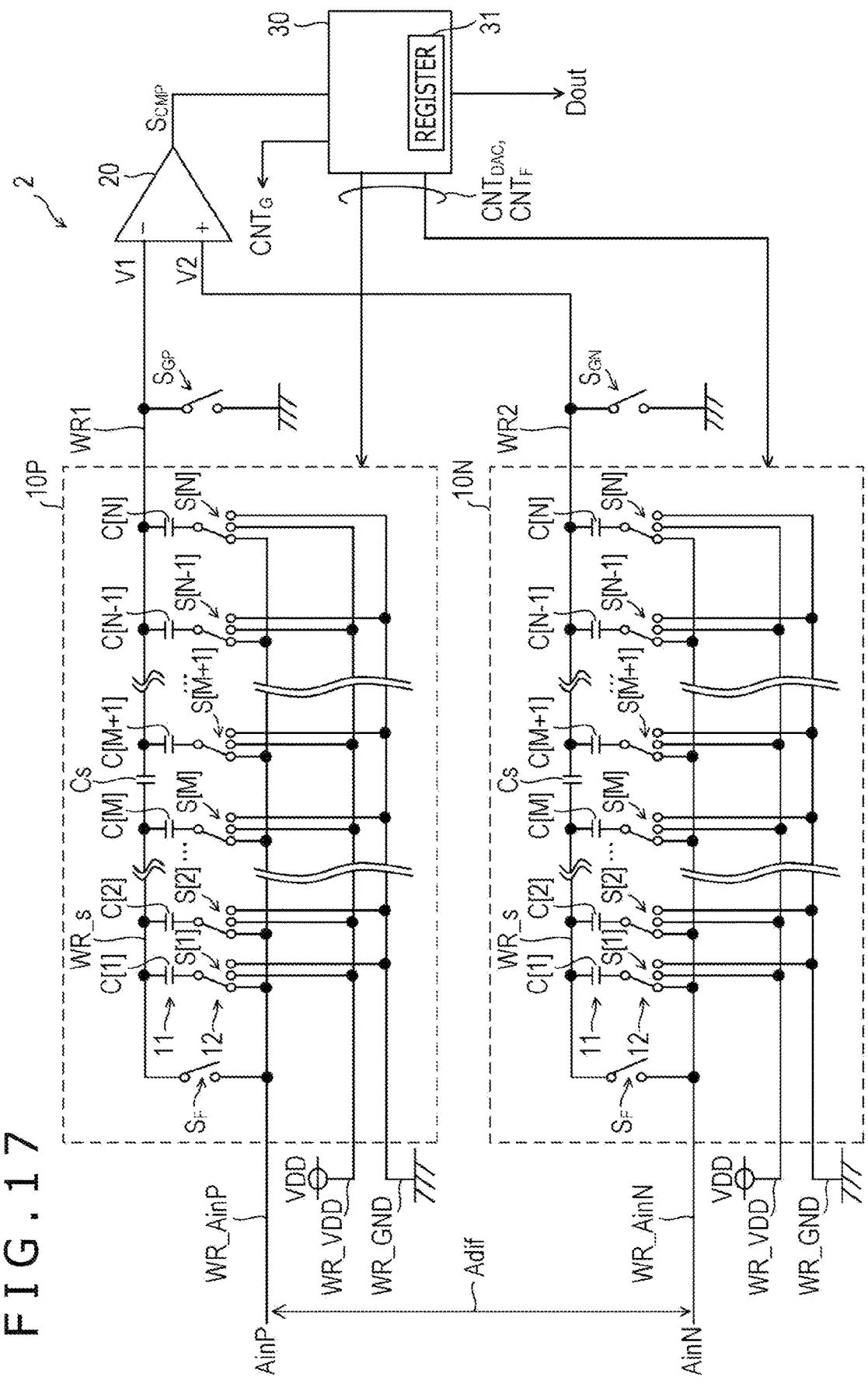
FIG. 17 is a general configuration diagram of an AD converter according to a third embodiment of the present disclosure.

A third embodiment of the present disclosure will be described. The configuration and operation of the AD converter 1 illustrated in the first embodiment may be applied to an AD converter having a differential-input configuration. FIG. 17 illustrates a general configuration of an AD converter 2 resulting from the application. As with the AD converter 1 described above, the AD converter 2 is a successive approximation A/D converter circuit. Analog input signals AinP and AinN are input to the AD converter 2. The AD converter 2 performs an AD conversion operation on a difference signal Adif between the analog input signals AinP and AinN. Suppose that the difference signal Adif is an analog signal having a potential of the analog input signal AinP as viewed from a potential of the analog input signal AinN.

The AD conversion operation on the difference signal Adif converts the difference signal Adif into a digital signal by a binary search, and outputs the resulting digital signal as the digital output signal Dout. As in the first embodiment, the digital output signal Dout is a digital signal of N bits. The digital output signal Dout may have a predetermined intermediate value when "AinP=AinN." The value of the digital output signal Dout may increase from the intermediate value as the magnitude of the difference signal Adif increases, when "AinP>AinN." The value of the digital output signal Dout may decrease from the intermediate value as the magnitude of the difference signal Adif increases, when "AinP<AinN."

The AD converter 2 has two comparison voltage generating blocks. Each of the comparison voltage generating blocks includes the DAC 10 and the switch $S_G$ described in the first embodiment. A configuration of the DAC 10 and the switch $S_G$ in each of the comparison voltage generating blocks is the same as the configuration of the DAC 10 and the switch $S_G$ described in the first embodiment. Accordingly, in each of the comparison voltage generating blocks, the DAC 10 includes the capacitor array 11 constituted by the capacitors C[1] to C[N] and the switch array 12 constituted by the switches S[1] to S[N]. Connection relation between the capacitors C[1] to C[N] and the switches S[1] to S[N] in each of the comparison voltage generating blocks is the same as the connection relation between the capacitors C[1] to C[N] and the switches S[1] to S[N] in the first embodiment.

In the following, the DAC 10 and the switch $S_G$ provided to one of the two comparison voltage generating blocks provided to the AD converter 2 will be particularly referred to as a DAC 10P and a switch $S_{GP}$, respectively, and the DAC 10 and the switch $S_G$ provided to the other comparison voltage generating block will be particularly referred to as a DAC 10N and a switch $S_{GN}$, respectively.

Wiring WR_AinP is analog input wiring to which the analog input signal AinP is applied. Wiring WR_AinN is analog input wiring to which the analog input signal AinN is applied. As in the first embodiment, wiring WR_VDD is power supply wiring to which a predetermined power supply voltage VDD is applied, and wiring WR_GND is ground wiring to which a ground voltage is applied. The analog input signals AinP and AinN respectively correspond to analog input signals Ain for the DACs 10P and 10N.

In the configuration of FIG. 17, the DACs 10P and 10N each have the same configuration as that of the DAC 10_1 (see FIG. 2). Accordingly, first terminals of capacitors C[M+1] to C[N] of the DAC 10P are all connected to the comparison wiring WR1, and first terminals of capacitors C[M+1] to C[N] of the DAC 10N are all connected to the comparison wiring WR2. As in the first embodiment, a voltage applied to the comparison wiring WR1 is a comparison voltage V1, and a voltage applied to the comparison wiring WR2 is a comparison voltage V2.

Each of the DACs 10P and 10N is provided with a scaling capacitor Cs, target wiring WR_s, and a switch $S_F$. In the DAC 10P, the scaling capacitor Cs is provided in series between the wiring WR1 and the wiring WR_s, and the switch $S_F$ is provided in series between the wiring WR_s and the wiring WR_AinP. Similarly, in the DAC 10N, the scaling capacitor Cs is provided in series between the wiring WR2 and the wiring WR_s, and the switch $S_F$ is provided in series between the wiring WR_s and the wiring WR_AinN.

Specifically, a first terminal of the scaling capacitor Cs of the DAC 10P is connected to the comparison wiring WR1. A second terminal of the scaling capacitor Cs of the DAC 10P is connected to the target wiring WR_s of the DAC 10P. A first terminal of the switch S F in the DAC 10P is connected to the target wiring WR_s of the DAC 10P. A second terminal of the switch $S_F$ in the DAC 10P is connected to the wiring WR_AinP. A first terminal of the scaling capacitor Cs of the DAC 10N is connected to the comparison wiring WR2. A second terminal of the scaling capacitor Cs of the DAC 10N is connected to the target wiring WR_s of the DAC 10N. A first terminal of the switch S F in the DAC 10N is connected to the target wiring WR_s of the DAC 10N. A second terminal of the switch $S_F$ in the DAC 10N is connected to the wiring WR_AinN.

In each of the DACs 10P and 10N, a switch S[i] is provided to correspond to a capacitor C[i]. In each of the DACs 10P and 10N, the capacitor C[i] corresponds to the ith bit in the digital output signal Dout.

The switches S[1] to S[N] each have a common terminal $T_{COM}$ and switching terminals Ta, Tb, and Tc (see FIG. 3). Respective first terminals of the capacitors C[1] to C[M] in the DAC 10P are connected to the target wiring WR_s in the DAC 10P. Respective first terminals of the capacitors C[1] to C[M] in the DAC 10N are connected to the target wiring WR_s in the DAC 10N. In each of the DACs 10P and 10N, the common terminal $T_{COM}$ of the switch S[i] is connected to a second terminal of the capacitor C[i]. The respective switching terminals Ta of the switches S[1] to S[N] in the DAC 10P are connected to the wiring WR_AinP, and receive the analog input signal AinP. The respective switching terminals Ta of the switches S[1] to S[N] in the DAC 10N are connected to the wiring WR_AinN, and receive the analog input signal AinN. In each of the DACs 10P and 10N, the respective switching terminals Tb of the switches S[1] to S[N] are connected to the wiring WR_VDD, and receive the power supply voltage VDD. In each of the DACs 10P and 10N, the respective switching terminals Tc of the switches S[1] to S[N] are connected to the wiring WR_GND, and receive the ground voltage.

In the DAC 10P, the analog input signal AinP, the power supply voltage VDD, and the ground voltage are applied to the second terminal of the capacitor C[i] in the signal input state, the power supply connection state, and the ground state, respectively, of the switch S[i] (see FIG. 4). In the DAC 10N, the analog input signal AinN, the power supply voltage VDD, and the ground voltage are applied to the second terminal of the capacitor C[i] in the signal input state, the power supply connection state, and the ground state, respectively, of the switch S[i] (see FIG. 4). Incidentally, FIG. 17 illustrates, as an example, a state in which the switches S[1] to S[N] are all set in the signal input state in the DACs 10p and 10N.

The switches $S_{GP}$ and $S_{GN}$ are short-circuiting switches. The switch $S_{GP}$ is provided in series between the comparison wiring WR1 and the ground. That is, a first terminal of the switch $S_{GP}$ is connected to the comparison wiring WR1, and a second terminal of the switch $S_{GP}$ is connected to the ground (or in other words, connected to the wiring WR_GND). The switch $S_{GN}$ is provided in series between the comparison wiring WR2 and the ground. That is, a first terminal of the switch $S_{GN}$ is connected to the comparison wiring WR2, and a second terminal of the switch $S_{GN}$ is connected to the ground (or in other words, connected to the wiring WR_GND).

The switches $S_{GP}$ and $S_{GN}$ are controlled to be in the on state or the off state by the control circuit 30. When the switch $S_{GP}$ is on, there is conduction between the first terminal and the second terminal of the switch $S_{GP}$, and therefore, the voltage of the comparison wiring WR1 (that is, the comparison voltage V1) is fixed at 0 V. When the switch $S_{GP}$ is off, there is an interruption (non-conduction) between the first terminal and the second terminal of the switch $S_{GP}$, and therefore, the switch $S_{GP}$ does not affect the comparison voltage V1. When the switch $S_{GN}$ is on, there is conduction between the first terminal and the second terminal of the switch $S_{GN}$, and therefore, the voltage of the comparison wiring WR2 (that is, the comparison voltage V2) is fixed at 0 V. When the switch $S_{GN}$ is off, there is an interruption (non-conduction) between the first terminal and the second terminal of the switch $S_{GN}$, and therefore, the switch $S_{GN}$ does not affect the comparison voltage V2. Incidentally, FIG. 17 illustrates, as an example, a state in which the switches $S_{GP}$ and $S_{GN}$ are off.

The comparator 20 is connected to the comparison wiring WR1 and the comparison wiring WR2. As in the first embodiment, the comparator 20 of the AD converter 2 compares the comparison voltages V1 and V2 with each other, and generates and outputs a comparison result signal $S_{CMP}$ indicating a result of the comparison (height relation) between the comparison voltages V1 and V2. In the AD converter 2, however, the comparison voltage V2 is output from the DAC 10N. The comparison result signal $S_{CMP}$ is a binarized signal having a value of "0" or "1." The comparator 20 has a non-inverting input terminal, an inverting input terminal, and an output terminal. Suppose here that the inverting input terminal is connected to the comparison wiring WR1 and that the non-inverting input terminal is connected to the comparison wiring WR2. The comparator 20 outputs the comparison result signal $S_{CMP}$ having the value of "1" from the output terminal of the comparator 20 itself when "V1<V2" holds. The comparator 20 outputs the comparison result signal $S_{CMP}$ having the value of "0" from the output terminal of the comparator 20 itself when "V1>V2" holds. The comparison result signal $S_{CMP}$ has the value of "0" or "1" when "V1=V2" holds.

The control circuit 30 receives the comparison result signal $S_{CMP}$. The control circuit 30 controls the AD conversion operation as a whole, and outputs the digital output signal Dout obtained by the AD conversion operation. As in the first embodiment, the control circuit 30 is provided with a register 31. The value of the digital output signal Dout can be stored in the register 31. The control circuit 30 individually controls the states of the switches S[1] to S[N] in the DACs 10p and 10N by supplying a control signal $CNT_{DAC}$ (DAC input signal) to the DACs 10p and 10N. In addition, the control circuit 30 controls the states of the respective switches $S_F$ of the DACs 10p and 10N by supplying a control signal $CNT_F$ to the DACs 10p and 10N. The control circuit 30 further controls the states of the switches $S_{GP}$ and $S_{GN}$ by supplying a control signal $CNT_G$ to the switches $S_{GP}$ and $S_{GN}$.

In each of the DACs 10p and 10N, the capacitance values of the capacitors C[1] to C[N] are set as in the first embodiment (see FIG. 5).

As in the first embodiment, the AD conversion operation in the AD converter 2 sequentially performs the operations of steps S1 to S4 (see FIG. 6).

Figure 18:
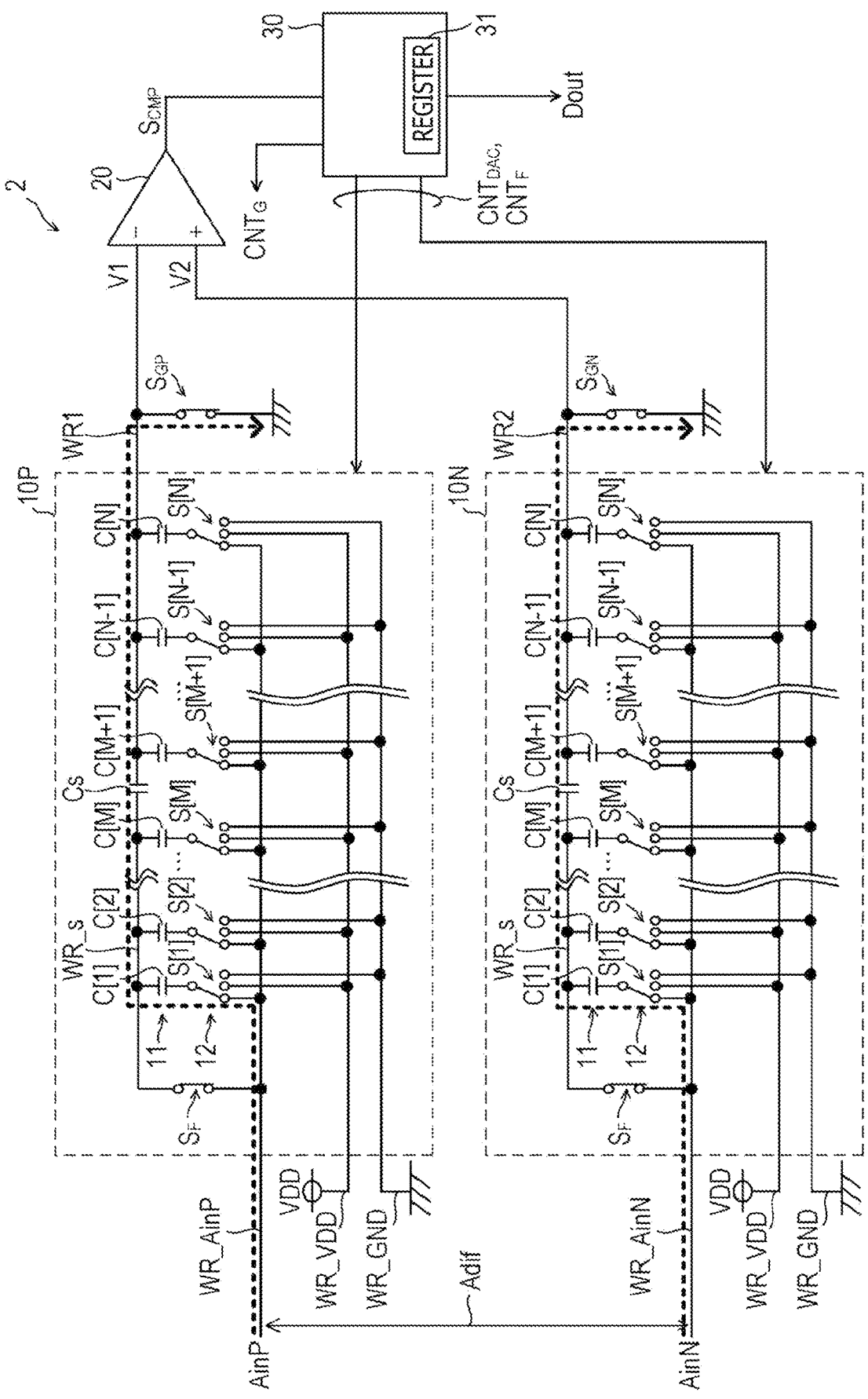
FIG. 18 relates to the third embodiment of the present disclosure, and is a diagram illustrating a state of the AD converter when a sampling operation is performed.

FIG. 18 illustrates a state of the AD converter 2 in the sampling period. The sampling period has a predetermined time length. In the sampling period, the control circuit 30 controls all of the switches S[1] to S[N] in the DACs 10P and 10N to be in the signal input state, controls the switches $S_{GP}$ and $S_{GN}$ to be on, and controls the respective switches $S_F$ in the DACs 10P and 10N to be on.

In the sampling period, the wiring WR_AinP is connected to the capacitor array 11 via the switch array 12 in the DAC 10P. Consequently, a charge corresponding to the analog input signal AinP is stored in each capacitor in the capacitor array 11 of the DAC 10P, and is also stored in the scaling capacitor Cs in the DAC 10P. Similarly, in the sampling period, the wiring WR_AinN is connected to the capacitor array 11 via the switch array 12 in the DAC 10N. Consequently, a charge corresponding to the analog input signal AinN is stored in each capacitor in the capacitor array 11 of the DAC 10N, and is also stored in the scaling capacitor Cs in the DAC 10N.

In the sampling period, the comparison wiring WR1 and the comparison wiring WR2 are connected to the ground via the switches $S_{GP}$ and $S_{GN}$. Thus, each capacitor in the capacitor array 11 in the DAC 10P is charged by the analog input signal AinP with the ground voltage as a reference (and the scaling capacitor Cs in the DAC 10P is also similarly charged), and each capacitor in the capacitor array 11 in the DAC 10N is charged by the analog input signal AinN with the ground voltage as a reference (and the scaling capacitor Cs in the DAC 10N is also similarly charged). Incidentally, the operation of the comparator 20 may be stopped in the sampling period. In addition, in the sampling period, each of the switches $S_F$ is on, so that the potential of the target wiring WR_s in the DAC 10P is fixed at the potential of the analog input signal AinP, and the potential of the target wiring WR_s in the DAC 10N is fixed at the potential of the analog input signal AinN.

The state transition operation in step S2 performs, on each of the two comparison voltage generating blocks, an operation similar to the state transition operation illustrated in the first embodiment. The state transition operation may perform the operations of steps S21, S22, S23, and S24 in this order (see FIG. 8).

In the connection releasing operation of step S21, the states of the switches S[1] to S[N] in each of the DACs 10P and 10N are all switched from the signal input state to the open state. In the first transition switching operation of step S22, the states of the respective switches $S_F$ in the DACs 10P and 10N are switched from on to off. After step S22, each of the switches $S_F$ is maintained in the off state until completion of the successive approximation operation of step S3. In the second transition switching operation of step S23, the states of the switches $S_{GP}$ and $S_{GN}$ are switched from on to off. After step S23, the switches $S_{GP}$ and $S_{GN}$ are maintained in the off state until completion of the successive approximation operation of step S3. In the successive approximation preparatory operation of step S24, the states of the respective switches S[1] to S[N] of the DACs 10P and 10N are switched to the power supply connection state or the ground connection state. Incidentally, as illustrated in the first embodiment, the operation contents of step S22 and the operation contents of step S23 may be reversed.

Figure 19:
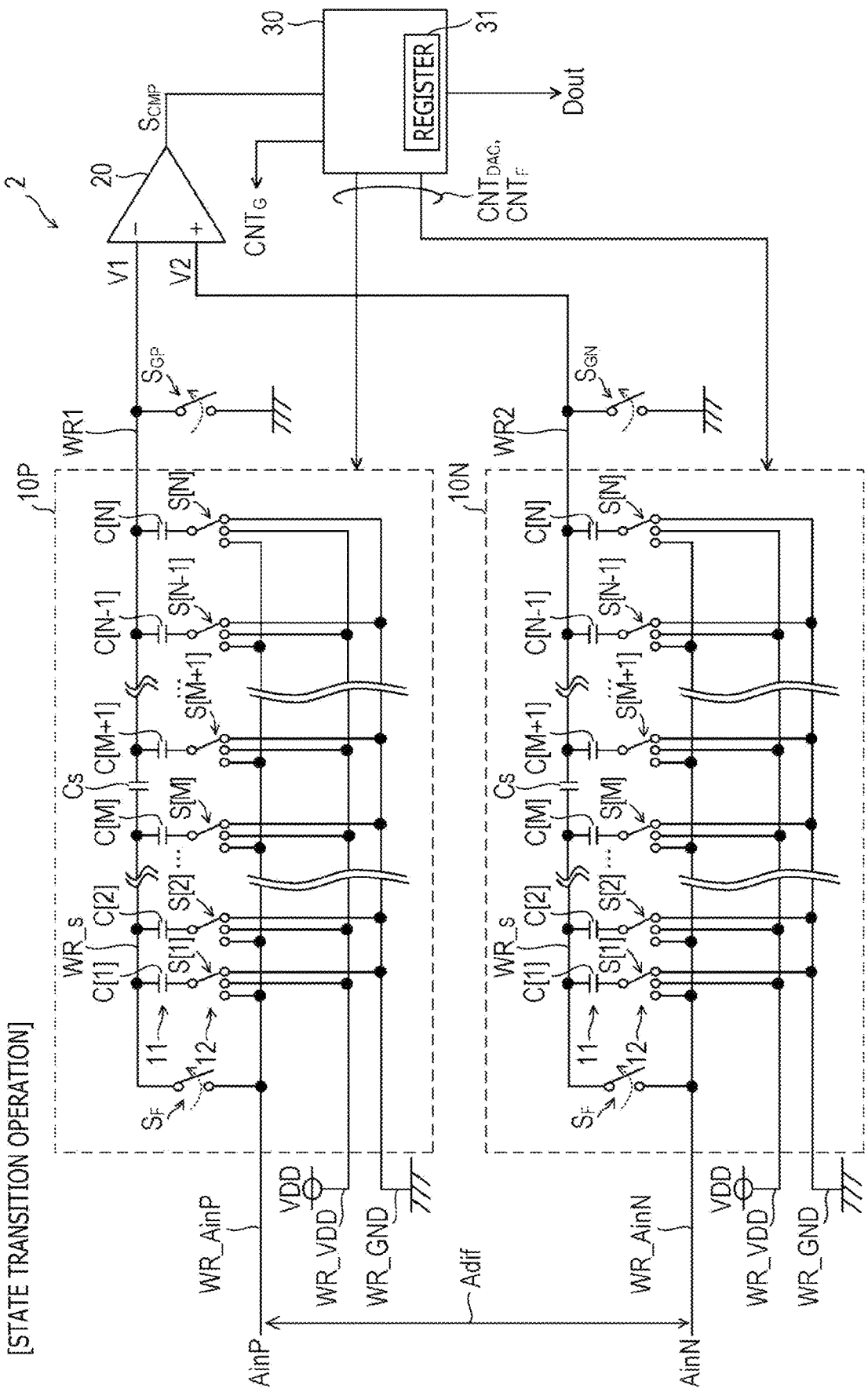
FIG. 19 relates to the third embodiment of the present disclosure, and is a diagram illustrating a state of the AD converter in relation to a successive transition operation.

FIG. 19 illustrates a state of the AD converter 2 that has undergone the operations of steps S21 to S24. The example of FIG. 19 assumes that the states of the respective switches S[1] to S[N] of the DACs 10P and 10N are all switched to the ground connection state in step S24.

As described in the first embodiment, the transition timings of the states of the respective switches in the state transition operation can be changed variously. In this respect, the description of the first embodiment is applied also to the present embodiment. Accordingly, for example, in the state transition operation according to the third embodiment, the operations of steps S21 to S23 may be performed simultaneously, the operation of step S23 may be performed after the operations of steps S21 and S22 are performed simultaneously, or the operations of steps S22 and S23 may be performed simultaneously after the operation of step S21 is performed. At this time, the operation of step S24 is performed simultaneously with the operation of step S23 or after the operation of step S23. Alternatively, the operation of step S24 can be omitted.

In the successive approximation period in which the successive approximation operation of step S3 (see FIG. 6) is performed, the respective switches $S_F$ in the DACs 10P and 10N and the switches $S_{GP}$ and SAN are maintained in the off state. The values Rg[1] to Rg[N] of the register 31 are determined on a bit-by-bit basis from a high order bit side in the successive approximation operation. The determined value Rg[i] is the value of the ith bit in the digital output signal Dout. In the successive approximation operation (in other words, in the successive approximation period), the control circuit 30 determines the values Rg[1] to Rg[N] (that is, the value of the digital output signal Dout) on a bit-by-bit basis while sequentially changing the states of the switch arrays 12 of the DACs 10P and 10N by a binary search on the basis of the comparison result signal $S_{CMP}$.

A flowchart of the successive approximation operation in step S3 in the AD converter 2 is the same as that of FIG. 10.

The successive approximation operation in the first embodiment is applied also to the present embodiment. However, in cases where the state of the switch S[j] is controlled, set, maintained, and switched to be in the power supply connection state in the first embodiment, the state of the switch S[j] in each of the DAC 10P and the DAC 10N is interpreted as being controlled, set, maintained, and switched to be in the power supply connection state in the third embodiment. Similarly, in cases where the state of the switch S[j] is controlled, set, maintained, and switched to be in the ground connection state in the first embodiment, the state of the switch S[j] in each of the DAC 10P and the DAC 10N is interpreted as being controlled, set, maintained, and switched to be in the ground connection state in the third embodiment. In the successive approximation period according to the present embodiment, the comparison voltages V1 and V2 each have a positive or negative voltage value or are 0 V. Therefore, the comparator 20 is supplied with a positive power supply voltage and a negative power supply voltage. The positive power supply voltage may be the power supply voltage VDD. The negative power supply voltage has a voltage value of (−VDD), for example.

In the result output operation of step S4 (see FIG. 6), the control circuit 30 outputs, as the digital output signal Dout, a digital signal having the values Rg[1] to Rg[N] determined in the successive approximation operation of step S3.

Also in the AD converter 2 having a differential input configuration, the need for the initializing operation described above can be obviated by installing the potential fixing switches $S_F$. An improvement in the maximum sampling rate is made possible by obviating the need for the initializing operation.

Fourth Embodiment

A fourth embodiment of the present disclosure will be described. As the technology illustrated in the second embodiment can be applied to the configuration of the first embodiment, the technology illustrated in the second embodiment can be applied also to the third embodiment. With regard to this, a description is added in the following. The fourth embodiment includes the following examples EX4_1 to EX4_3 corresponding to the examples EX2_1 to EX2_3 described above. Items described in a given example among the examples EX4_1 to EX4_3 can be applied to another given example (that is, two or more given examples among the plurality of examples can be combined with each other) as long as there is no contradiction. [Example EX4_1]

Figure 20:
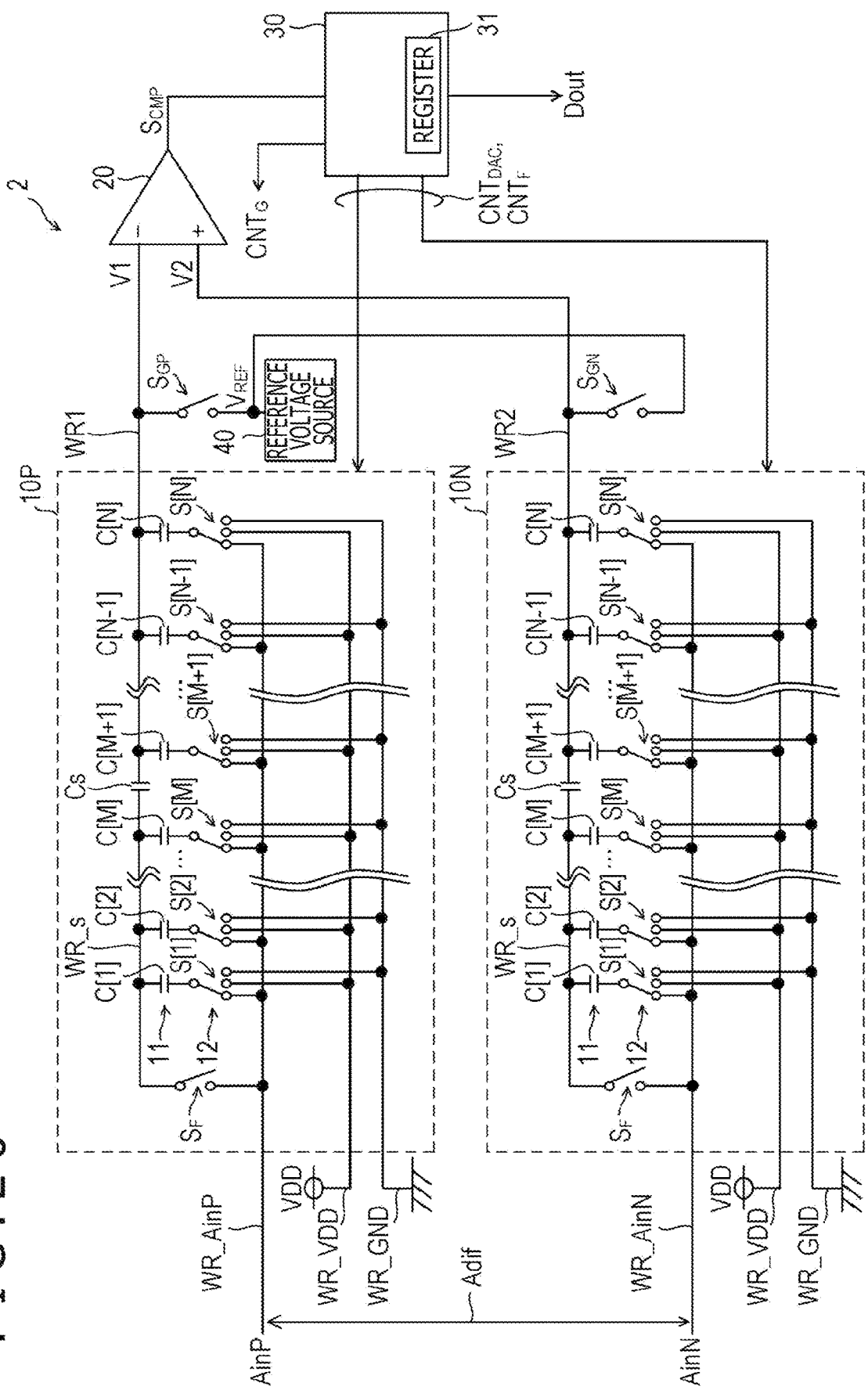
FIG. 20 relates to an example EX4_1 belonging to a fourth embodiment of the present disclosure, and is a general configuration diagram of an AD converter.

The example EX4_1 will be described. As illustrated in FIG. 20, to the AD converter 2 according to the third embodiment, the reference voltage source 40 described above may be added.

In the AD converter 2 according to the example EX4_1, the first terminal of the switch $S_{GP}$ is connected to the comparison wiring WR1, and the first terminal of the switch $S_{GN}$ is connected to the comparison wiring WR2, whereas the second terminal of the switch $S_{GP}$ and the second terminal of the switch $S_{GN}$ are connected to the reference voltage source 40 and receive the reference voltage $V_{REF}$. Therefore, when the switches $S_{GP}$ and $S_{GN}$ are on, the respective voltages of the comparison wiring WR1 and the comparison wiring WR2 are fixed at the reference voltage $V_{REF}$ That is, in the AD converter 2 according to the example EX4_1, when the switches $S_{GP}$ and $S_{GN}$ are turned on in the sampling period, each capacitor in the capacitor array 11 in the DAC 10P is charged by the analog input signal AinP with the reference voltage $V_{REF}$ as a reference (and the scaling capacitor Cs in the DAC 10P is similarly charged), and each capacitor in the capacitor array 11 in the DAC 10N is charged by the analog input signal AinP with the reference voltage $V_{REF}$ as a reference (and the scaling capacitor Cs in the DAC 10N is also similarly charged).

The comparison voltages V1 and V2 in the successive approximation period can be held at 0 V or higher at all times by appropriately setting a value of the reference voltage $V_{REF}$ in advance. As a result, the negative power supply voltage for the comparator 20 can be rendered unnecessary.

Example EX4_2

The example EX4_2 will be described. The number of scaling capacitors Cs provided to each of the DACs 10P and 10N (the number of serial stages) may be any number as long as the number is one or more. Hence, for example, the DAC 10_2 illustrated in FIG. 15 may be used as each of the DACs 10P and 10N. In this case, the DACs 10P and 10N each include the capacitor array 11_2, the switch array 12_2, the scaling capacitors Cs1 and Cs2, the target wiring WR_s1 and WR_s2, and the switches $S_{F1}$ and $S_{F2}$. The description of the example EX2_2 is applied also to the AD converter 2. However, at a time of this application, the following interpretation is made.

In the DAC 10P having the same configuration as that of the DAC 10_2 (which DAC 10P will hereinafter be referred to as a DAC 10P 2 for convenience), the switch $S_{F1}$ is inserted in series between the wiring WR_s1 and the wiring WR_AinP. That is, the first terminal and the second terminal of the switch $S_{F1}$ are respectively connected to the wiring WR_s1 and the wiring WR_AinP. In the DAC 10P 2, the switch $S_{F2}$ is inserted in series between the wiring WR_s2 and the wiring WR_AinP. That is, the first terminal and the second terminal of the switch $S_{F2}$ are respectively connected to the wiring WR_s2 and the wiring WR_AinP. In the DAC 10P 2, the respective switching terminals Ta of the switches S[1] to S[N] are connected to the wiring WR_AinP, and receive the analog input signal AinP.

In the DAC 10N having the same configuration as that of the DAC 10_2 (which DAC 10N will hereinafter be referred to as a DAC 10N 2 for convenience), the switch $S_{F1}$ is inserted in series between the wiring WR_s1 and the wiring WR_AinN. That is, the first terminal and the second terminal of the switch $S_{F1}$ are respectively connected to the wiring WR_s1 and the wiring WR_AinN. In the DAC 10N 2, the switch $S_{F2}$ is inserted in series between the wiring WR_s2 and the wiring WR_AinN. That is, the first terminal and the second terminal of the switch $S_{F2}$ are respectively connected to the wiring WR_s2 and the wiring WR_AinN. In the DAC 10N 2, the respective switching terminals Ta of the switches S[1] to S[N] are connected to the wiring WR_AinN, and receive the analog input signal AinN.

Otherwise, the configuration and operation of the AD converter 2 having the DACs 10P 2 and 10N 2 are similar to those of the AD converter 2 according to the third embodiment, and the description of the third embodiment is applied also to the AD converter 2 having the DACs 10P 2 and 10N 2. However, at a time of this application, the switch $S_F$ in the third embodiment is read as the switches $S_{F1}$ and $S_{F2}$. Specifically, when the switches $S_F$ in the respective DACs 10 are turned on in the third embodiment, the switches $S_{F1}$ and $S_{F2}$ in the DACs 10P 2 and 10N 2 are turned on in the AD converter 2 having the DACs 10P 2 and 2. Similarly, when the switches $S_F$ in the respective DACs 10 are turned off in the third embodiment, the switches $S_{F1}$ and $S_{F2}$ in the DACs 10P 2 and 10N 2 are turned off in the AD converter 2 having the DACs 10P 2 and 10N 2. In the DAC 10P 2, the potential of the target wiring WR_s1 and WR_s2 is fixed at the potential of the analog input signal AinP by turning on the switches $S_{F1}$ and $S_{F2}$ in the sampling period, and the switches $S_{F1}$ and $S_{F2}$ are maintained in the off state in the successive approximation period. In the DAC 10N 2, the potential of the target wiring WR_s1 and WR_s2 is fixed at the potential of the analog input signal AinN by turning on the switches $S_{F1}$ and $S_{F2}$ in the sampling period, and the switches $S_{F1}$ and $S_{F2}$ are maintained in the off state in the successive approximation period.

Example EX4_3

The example EX4_3 will be described. The description with regard to the switch $S_F$ illustrated in the example EX2_3 may be applied to all of the potential fixing switches ($S_F$, $S_{F1}$, and $S_{F2}$) in the third and fourth embodiments, and the description with regard to the switch $S_G$ illustrated in the example EX2_3 may be applied to all of the short-circuiting switches ($S_{GP}$ and $S_{GN}$) in the third and fourth embodiments. Accordingly, for example, the size of each switch S F in FIG. 17 may be smaller than the size of the switch $S_{GP}$ and the size of the switch $S_{GN}$. In FIG. 17, the two switches $S_F$ may have a mutually identical size, and the switches $S_{GP}$ and $S_{GN}$ may have a mutually identical size.

The embodiments of the present disclosure can be modified in various manners as appropriate within the scope of technical ideas illustrated in claims. The above embodiments are merely an example of embodiments of the present disclosure, and the meanings of terms of the present disclosure or respective constituent elements are not limited to those described in the above embodiments. Specific numerical values illustrated in the foregoing descriptive sentences are merely illustrative, and, needless to say, the numerical values can be changed to various numerical values.

Supplementary Notes

Supplementary notes will be provided for the present disclosure whose specific configuration examples have been illustrated in the foregoing embodiments.

A successive approximation AD converter circuit according to one example of the present disclosure has a configuration (first configuration) of a successive approximation AD converter circuit (for example, the AD converter 1) configured to convert an analog input signal (Ain) into a digital output signal (Dout), the successive approximation AD converter circuit including a capacitor DAC (10) including a capacitor array (11) and a switch array (12) connected to the capacitor array, the capacitor DAC being configured to cause a charge corresponding to the analog input signal to be stored in each capacitor in the capacitor array by connecting wiring (Ain) to which the analog input signal is applied to the capacitor array via the switch array in a sampling period, and generate a first comparison voltage (V1) based on the stored charge of the capacitor array in first comparison wiring (WR1) in a state of supplying a predetermined power supply voltage or a ground voltage to each capacitor in the capacitor array via the switch array in a successive approximation period after the sampling period, a comparator (20) connected to the first comparison wiring and second comparison wiring (WR2) to which a second comparison voltage (V2) is applied, the comparator being configured to compare the first comparison voltage and the second comparison voltage with each other and generate a comparison result signal ($S_{CMP}$) in the successive approximation period, and a control circuit (30) configured to determine a value of the digital output signal while controlling a state of the switch array on a basis of the comparison result signal in the successive approximation period, the capacitor array including a first local array (11_1a; see FIG. 1 and FIG. 5) provided between the first comparison wiring and the switch array and a second local array (11_1b; see FIG. 1 and FIG. 5) provided between target wiring (WR_s) and the switch array, and the capacitor DAC being provided with a scaling capacitor (Cs) between the target wiring and the first comparison wiring and being provided with a potential fixing switch ($S_F$) between the target wiring and the wiring to which the analog input signal is applied.

It is thereby possible to obviate a need for the initializing operation described above. An improvement in the maximum sampling rate is made possible by obviating the need for the initializing operation.

In the successive approximation AD converter circuit according to the foregoing first configuration, there may be adopted a configuration (second configuration) in which the control circuit fixes a potential of the target wiring at a potential of the analog input signal by turning on the potential fixing switch in the sampling period, and turns off the potential fixing switch in the successive approximation period.

In the successive approximation AD converter circuit according to the foregoing second configuration, there may be adopted a configuration (third configuration) in which the successive approximation AD converter circuit further includes a short-circuiting switch ($S_G$) having a first terminal connected to the first comparison wiring, in which the ground voltage (VDD) or a predetermined reference voltage ($V_{REF}$) is applied to a second terminal of the short-circuiting switch, and the control circuit turns on the short-circuiting switch in the sampling period, and turns off the short-circuiting switch in the successive approximation period.

In the successive approximation AD converter circuit according to the foregoing third configuration, there may be adopted a configuration (fourth configuration) in which the control circuit makes a transition from the sampling period through a state transition operation to the successive approximation period, and switches the potential fixing switch and the short-circuiting switch from on to off simultaneously or in different timings in the state transition operation.

In the successive approximation AD converter circuit according to the foregoing third or fourth configuration, there may be adopted a configuration (fifth configuration) in which the potential fixing switch and the short-circuiting switch are each formed by a switching element based on a semiconductor, and a size of the potential fixing switch is smaller than a size of the short-circuiting switch.

It is thereby possible to suppress an amount of increase in the size of the circuit as a whole which increase is attendant on the installation of the potential fixing switch.

In the successive approximation AD converter circuit according to one of the foregoing first to fifth configurations, there may be adopted a configuration (sixth configuration) in which the control circuit determines the value of the digital output signal on a bit-by-bit basis while sequentially changing the state of the switch array by a binary search on the basis of the comparison result signal in the successive approximation period.

In the successive approximation AD converter circuit according to the foregoing sixth configuration, there may be adopted a configuration (seventh configuration) in which the digital output signal is a digital signal of N bits including a first bit to an Nth bit, the capacitor array includes a first capacitor to an Nth capacitor (C[1] to C[N]) corresponding to the first bit to the Nth bit and each having a first terminal and a second terminal, a capacitor group of a part of the first capacitor to the Nth capacitor forms the first local array (11_1a), and a capacitor group of another part of the first capacitor to the Nth capacitor forms the second local array (11_1b), the first terminal of each capacitor forming the first local array is connected to the first comparison wiring (WR1), and the first terminal of each capacitor forming the second local array is connected to the target wiring (WR_s), the switch array includes a first switch to an Nth switch (S[1] to S[N]) corresponding to the first capacitor to the Nth capacitor, an ith switch has a first switching terminal (Ta), a second switching terminal (Tb), a third switching terminal (Tc), and a common terminal ($T_{COM}$) connected to the second terminal of an ith capacitor, in each of the first to Nth switches, the analog input signal is applied to the first switching terminal, the power supply voltage is applied to any one of the second switching terminal and the third switching terminal, and the ground voltage is applied to the other of the second switching terminal and the third switching terminal, the control circuit connects the first switching terminal to the common terminal in each of the first to Nth switches in the sampling period, and determines a value of each bit of the digital output signal by a binary search on the basis of the comparison result signal in a state in which the second switching terminal or the third switching terminal is selectively connected to the common terminal in each of the first to Nth switches in the successive approximation period following the sampling period, and N denotes an integer of 2 or more, and i denotes a natural number equal to or less than N.

A successive approximation AD converter circuit according to another example of the present disclosure has a configuration (eighth configuration) of a successive approximation AD converter circuit (2) configured to convert a difference signal (Adif) between a first analog input signal (AinP) and a second analog input signal (AinN) into a digital output signal (Dout), the successive approximation AD converter circuit including a first capacitor DAC (10P) including a first capacitor array (11 in the DAC 10P) and a first switch array (12 in the DAC 10P) connected to the first capacitor array, the first capacitor DAC being configured to cause a charge corresponding to the first analog input signal to be stored in each capacitor in the first capacitor array by connecting wiring to which the first analog input signal is applied to the first capacitor array via the first switch array in a sampling period, and generate a first comparison voltage (V1) based on the stored charge of the first capacitor array in first comparison wiring (WR1) in a state of supplying a predetermined power supply voltage or a ground voltage to each capacitor in the first capacitor array via the first switch array in a successive approximation period after the sampling period, a second capacitor DAC (10N) including a second capacitor array (11 in the DAC 10N) and a second switch array (12 in the DAC 10N) connected to the second capacitor array, the second capacitor DAC being configured to cause a charge corresponding to the second analog input signal to be stored in each capacitor in the second capacitor array by connecting wiring to which the second analog input signal is applied to the second capacitor array via the second switch array in the sampling period, and generate a second comparison voltage (V1) based on the stored charge of the second capacitor array in second comparison wiring (WR2) in a state of supplying the power supply voltage or the ground voltage to each capacitor in the second capacitor array via the second switch array in the successive approximation period, a comparator (20) connected to the first comparison wiring and the second comparison wiring, the comparator being configured to compare the first comparison voltage and the second comparison voltage with each other and generate a comparison result signal ($S_{CMP}$) in the successive approximation period, and a control circuit (30) configured to determine a value of the digital output signal while controlling respective states of the first switch array and the second switch array on a basis of the comparison result signal in the successive approximation period, the first capacitor array including a first local array provided between the first comparison wiring and the first switch array and a second local array provided between first target wiring and the first switch array, the first capacitor DAC being provided with a first scaling capacitor between the first target wiring and the first comparison wiring and being provided with a first potential fixing switch between the first target wiring and the wiring to which the first analog input signal is applied, the second capacitor array including a third local array provided between the second comparison wiring and the second switch array and a fourth local array provided between second target wiring and the second switch array, and the second capacitor DAC being provided with a second scaling capacitor between the second target wiring and the second comparison wiring and being provided with a second potential fixing switch between the second target wiring and the wiring to which the second analog input signal is applied.

It is thereby possible to obviate a need for the initializing operation described above. An improvement in the maximum sampling rate is made possible by obviating the need for the initializing operation.

Incidentally, in relation between the eighth configuration and the AD converter 2 of FIG. 17 (see also FIG. 5), the first local array and the second local array respectively correspond to the local arrays 11_1a and 11_1b in the DAC 10P, the third local array and the fourth local array respectively correspond to the local arrays 11_1a and 11_1b in the DAC 10N, the first target wiring, the first scaling capacitor, and the first potential fixing switch respectively correspond to the target wiring WR_s, the scaling capacitor Cs, and the potential fixing switch $S_F$ in the DAC 10P, and the second target wiring, the second scaling capacitor, and the second potential fixing switch respectively correspond to the target wiring WR_s, the scaling capacitor Cs, and the potential fixing switch $S_F$ in the DAC 10N.

In the successive approximation AD converter circuit according to the foregoing eighth configuration, there may be adopted a configuration (ninth configuration) in which the control circuit fixes a potential of the first target wiring at a potential of the first analog input signal by turning on the first potential fixing switch and fixes a potential of the second target wiring at a potential of the second analog input signal by turning on the second potential fixing switch in the sampling period, and turns off the first potential fixing switch and the second potential fixing switch in the successive approximation period.

In the successive approximation AD converter circuit according to the foregoing ninth configuration, there may be adopted a configuration (tenth configuration) in which the successive approximation AD converter circuit further includes a first short-circuiting switch ($S_{GP}$) having a first terminal connected to the first comparison wiring and a second short-circuiting switch ($S_{GN}$) having a first terminal connected to the second comparison wiring, in which the ground voltage or a predetermined reference voltage ($V_{REF}$) is applied to a second terminal of each short-circuiting switch, and the control circuit turns on each short-circuiting switch in the sampling period, and turns off each short-circuiting switch in the successive approximation period.

In the successive approximation AD converter circuit according to the foregoing tenth configuration, there may be adopted a configuration (eleventh configuration) in which the control circuit makes a transition from the sampling period through a state transition operation to the successive approximation period, and switches each potential fixing switch and each short-circuiting switch from on to off simultaneously or in different timings in the state transition operation.

In the successive approximation AD converter circuit according to the foregoing tenth or eleventh configuration, there may be adopted a configuration (twelfth configuration) in which each potential fixing switch and each short-circuiting switch are formed by a switching element based on a semiconductor, and a size of each potential fixing switch is smaller than a size of each short-circuiting switch.

It is thereby possible to suppress an amount of increase in the size of the circuit as a whole which increase is attendant on the installation of the potential fixing switches.

In the successive approximation AD converter circuit according to one of the foregoing eighth to twelfth configurations, there may be adopted a configuration (thirteenth configuration) in which the control circuit determines the value of the digital output signal on a bit-by-bit basis while sequentially changing the states of the first and second switch arrays by a binary search on the basis of the comparison result signal in the successive approximation period.

In the successive approximation AD converter circuit according to the foregoing thirteenth configuration, there may be adopted a configuration (fourteenth configuration) in which the digital output signal is a digital signal of N bits including a first bit to an Nth bit, each capacitor array includes a first capacitor to an Nth capacitor (C[1] to C[N]) corresponding to the first bit to the Nth bit and each having a first terminal and a second terminal, each switch array includes a first switch to an Nth switch (S[1] to S[N]) corresponding to the first capacitor to the Nth capacitor, a capacitor group of a part of the first capacitor to the Nth capacitor in the first capacitor array forms the first local array, and a capacitor group of another part of the first capacitor to the Nth capacitor in the first capacitor array forms the second local array, a capacitor group of a part of the first capacitor to the Nth capacitor in the second capacitor array forms the third local array, and a capacitor group of another part of the first capacitor to the Nth capacitor in the second capacitor array forms the fourth local array, the first terminal of each capacitor forming the first local array is connected to the first comparison wiring (WR1), and the first terminal of each capacitor forming the second local array is connected to the first target wiring (WR_s in the DAC 10P), the first terminal of each capacitor forming the third local array is connected to the second comparison wiring (WR2), and the first terminal of each capacitor forming the fourth local array is connected to the second target wiring (WR_s in the DAC 10N), in each switch array, an ith switch has a first switching terminal (Ta), a second switching terminal (Tb), a third switching terminal (Tc), and a common terminal ($T_{COM}$) connected to the second terminal of an ith capacitor, in each of the first to Nth switches in the first switch array, the first analog input signal is applied to the first switching terminal, the power supply voltage is applied to any one of the second switching terminal and the third switching terminal, and the ground voltage is applied to the other of the second switching terminal and the third switching terminal, in each of the first to Nth switches in the second switch array, the second analog input signal is applied to the first switching terminal, the power supply voltage is applied to any one of the second switching terminal and the third switching terminal, and the ground voltage is applied to the other of the second switching terminal and the third switching terminal, the control circuit connects the first switching terminal to the common terminal in each of the first to Nth switches of each switch array in the sampling period, and determines a value of each bit of the digital output signal by a binary search on the basis of the comparison result signal in a state in which the second switching terminal or the third switching terminal is selectively connected to the common terminal in each of the first to Nth switches of each switch array in the successive approximation period following the sampling period, and N denotes an integer of 2 or more, and i denotes a natural number equal to or less than N.

According to the present disclosure, a successive approximation AD converter circuit that obviates a need for the initializing operation described above can be provided.

What is claimed is:

1. A successive approximation analog-to-digital converter circuit configured to convert an analog input signal into a digital output signal, the successive approximation analog-to-digital converter circuit comprising:
    a capacitor digital-to-analog converter including a capacitor array and a switch array connected to the capacitor array, the capacitor digital-to-analog converter being configured to cause a charge corresponding to the analog input signal to be stored in each capacitor in the capacitor array by connecting wiring to which the analog input signal is applied to the capacitor array via the switch array in a sampling period, and generate a first comparison voltage based on the stored charge of the capacitor array in first comparison wiring in a state of supplying a predetermined power supply voltage or a ground voltage to each capacitor in the capacitor array via the switch array in a successive approximation period after the sampling period;
    a comparator connected to the first comparison wiring and second comparison wiring to which a second comparison voltage is applied, the comparator being configured to compare the first comparison voltage and the second comparison voltage with each other and generate a comparison result signal in the successive approximation period; and
    a control circuit configured to determine a value of the digital output signal while controlling a state of the switch array on a basis of the comparison result signal in the successive approximation period, wherein
        the capacitor array includes a first local array provided between the first comparison wiring and the switch array and a second local array provided between target wiring and the switch array,
        each capacitor of the second local array is connected to the target wiring,
        the capacitor digital-to-analog converter includes:
            a scaling capacitor between the target wiring and the first comparison wiring; and
            a potential fixing switch between the target wiring and the wiring to which the analog input signal is applied, and the potential fixing switch includes:
                a first terminal directly connected to the target wiring, and
                a second terminal directly connected to the wiring to which the analog input signal is applied.

2. The successive approximation analog-to-digital converter circuit according to claim 1, wherein
    the control circuit fixes a potential of the target wiring at a potential of the analog input signal by turning on the potential fixing switch in the sampling period, and turns off the potential fixing switch in the successive approximation period.

3. The successive approximation analog-to-digital converter circuit according to claim 2, further comprising:
    a short-circuiting switch having a first terminal connected to the first comparison wiring, wherein
        the ground voltage or a predetermined reference voltage is applied to a second terminal of the short-circuiting switch, and
        the control circuit turns on the short-circuiting switch in the sampling period, and turns off the short-circuiting switch in the successive approximation period.

4. The successive approximation analog-to-digital converter circuit according to claim 3, wherein
    the control circuit makes a transition from the sampling period through a state transition operation to the successive approximation period, and switches the potential fixing switch and the short-circuiting switch from on to off simultaneously or in different timings in the state transition operation.

5. The successive approximation analog-to-digital converter circuit according to claim 3, wherein
    the potential fixing switch and the short-circuiting switch are each formed by a switching element based on a semiconductor, and
    a size of the potential fixing switch is smaller than a size of the short-circuiting switch.

6. The successive approximation analog-to-digital converter circuit according to claim 1, wherein
    the control circuit determines the value of the digital output signal on a bit-by-bit basis while sequentially changing the state of the switch array by a binary search on the basis of the comparison result signal in the successive approximation period.

7. The successive approximation analog-to-digital converter circuit according to claim 6, wherein
    the digital output signal is a digital signal of N bits including a first bit to an Nth bit,
    the capacitor array includes a first capacitor to an Nth capacitor corresponding to the first bit to the Nth bit and each having a first terminal and a second terminal,
    a capacitor group of a first part of the first capacitor to the Nth capacitor forms the first local array, and a capacitor group of a second part of the first capacitor to the Nth capacitor forms the second local array,
    the first terminal of each capacitor forming the first local array is connected to the first comparison wiring, and the first terminal of each capacitor forming the second local array is connected to the target wiring,
    the switch array includes a first switch to an Nth switch corresponding to the first capacitor to the Nth capacitor,
    an ith switch has a first switching terminal, a second switching terminal, a third switching terminal, and a common terminal connected to the second terminal of an ith capacitor,
    in each of the first switch to the Nth switch, the analog input signal is applied to the first switching terminal, the power supply voltage is applied to the second switching terminal, and the ground voltage is applied to the third switching terminal, the control circuit connects the first switching terminal to the common terminal in each of the first switch to the Nth switch in the sampling period, and determines a value of each bit of the digital output signal by the binary search on a basis of the comparison result signal in a state in which the second switching terminal or the third switching terminal is selectively connected to the common terminal in each of the first switch to the Nth switch in the successive approximation period following the sampling period, and N denotes an integer of 2 or more, and i denotes a natural number equal to or less than N.

8. A successive approximation analog-to-digital converter circuit configured to convert a difference signal between a first analog input signal and a second analog input signal into a digital output signal, the successive approximation analog-to-digital converter circuit comprising:

a first capacitor digital-to-analog converter including a first capacitor array and a first switch array connected to the first capacitor array, the first capacitor digital-to-analog converter being configured to cause a charge corresponding to the first analog input signal to be stored in each capacitor in the first capacitor array by connecting wiring to which the first analog input signal is applied to the first capacitor array via the first switch array in a sampling period, and generate a first comparison voltage based on the stored charge of the first capacitor array in first comparison wiring in a state of supplying a predetermined power supply voltage or a ground voltage to each capacitor in the first capacitor array via the first switch array in a successive approximation period after the sampling period;

a second capacitor digital-to-analog converter including a second capacitor array and a second switch array connected to the second capacitor array, the second capacitor digital-to-analog converter being configured to cause a charge corresponding to the second analog input signal to be stored in each capacitor in the second capacitor array by connecting wiring to which the second analog input signal is applied to the second capacitor array via the second switch array in the sampling period, and generate a second comparison voltage based on the stored charge of the second capacitor array in second comparison wiring in a state of supplying the power supply voltage or the ground voltage to each capacitor in the second capacitor array via the second switch array in the successive approximation period;

a comparator connected to the first comparison wiring and the second comparison wiring, the comparator being configured to compare the first comparison voltage and the second comparison voltage with each other and generate a comparison result signal in the successive approximation period; and a control circuit configured to determine a value of the digital output signal while controlling respective states of the first switch array and the second switch array on a basis of the comparison result signal in the successive approximation period, wherein the first capacitor array includes a first local array provided between the first comparison wiring and the first switch array and a second local array provided between first target wiring and the first switch array, each capacitor of the second local array is connected to the first target wiring, the first capacitor digital-to-analog converter includes:

a first scaling capacitor between the first target wiring and the first comparison wiring; and a first potential fixing switch between the first target wiring and the wiring to which the first analog input signal is applied, the first potential fixing switch includes:

a first terminal directly connected to the first target wiring, and a second terminal directly connected to the wiring to which the first analog input signal is applied, the second capacitor array includes a third local array provided between the second comparison wiring and the second switch array and a fourth local array provided between second target wiring and the second switch array, each capacitor of the fourth local array is connected to second the target wiring, the second capacitor digital-to-analog converter includes:

a second scaling capacitor between the second target wiring and the second comparison wiring; and a second potential fixing switch between the second target wiring and the wiring to which the second analog input signal is applied, and the second potential fixing switch includes:

a third terminal directly connected to the second target wiring, and a fourth terminal directly connected to the wiring to which the second analog input signal is applied.

9. The successive approximation analog-to-digital converter circuit according to claim 8, wherein the control circuit fixes a potential of the first target wiring at a potential of the first analog input signal by turning on the first potential fixing switch and fixes a potential of the second target wiring at a potential of the second analog input signal by turning on the second potential fixing switch in the sampling period, and turns off the first potential fixing switch and the second potential fixing switch in the successive approximation period.

10. The successive approximation analog-to-digital converter circuit according to claim 9, further comprising:

a first short-circuiting switch having a first terminal connected to the first comparison wiring; and a second short-circuiting switch having a first terminal connected to the second comparison wiring, wherein the ground voltage or a predetermined reference voltage is applied to a second terminal of each of the first short-circuiting switch and the second short-circuiting switch, and the control circuit turns on each of the first short-circuiting switch and the second short-circuiting switch in the sampling period, and turns off each of the first short-circuiting switch and the second short-circuiting switch in the successive approximation period.

11. The successive approximation analog-to-digital converter circuit according to claim 10, wherein the control circuit makes a transition from the sampling period through a state transition operation to the successive approximation period, and switches each of the first potential fixing switch, the second potential fixing switch, the first short-circuiting switch, and the second short-circuiting switch from on to off simultaneously or in different timings in the state transition operation.

12. The successive approximation analog-to-digital converter circuit according to claim 10, wherein each of the first potential fixing switch, the second potential fixing switch, the first short-circuiting switch, and the second short-circuiting switch are formed by a switching element based on a semiconductor, and a size of each of the first potential fixing switch and the second potential fixing switch is smaller than a size of each of the first short-circuiting switch and the second short-circuiting switch.

13. The successive approximation analog-to-digital converter circuit according to claim 8, wherein the control circuit determines the value of the digital output signal on a bit-by-bit basis while sequentially changing the states of the first switch array and the second switch array by a binary search on the basis of the comparison result signal in the successive approximation period.

14. The successive approximation analog-to-digital converter circuit according to claim 13, wherein the digital output signal is a digital signal of N bits including a first bit to an Nth bit, each of the first capacitor array and the second capacitor array includes a first capacitor to an Nth capacitor corresponding to the first bit to the Nth bit and each having a first terminal and a second terminal, each of the first switch array and the second switch array includes a first switch to an Nth switch corresponding to the first capacitor to the Nth capacitor, a capacitor group of a first part of the first capacitor to the Nth capacitor in the first capacitor array forms the first local array, and a capacitor group of a second part of the first capacitor to the Nth capacitor in the first capacitor array forms the second local array, a capacitor group of a first part of the first capacitor to the Nth capacitor in the second capacitor array forms the third local array, and a capacitor group of a second part of the first capacitor to the Nth capacitor in the second capacitor array forms the fourth local array, the first terminal of each capacitor forming the first local array is connected to the first comparison wiring, and the first terminal of each capacitor forming the second local array is connected to the first target wiring, the first terminal of each capacitor forming the third local array is connected to the second comparison wiring, and the first terminal of each capacitor forming the fourth local array is connected to the second target wiring, in each of the first switch array and the second switch array, an ith switch has a first switching terminal, a second switching terminal, a third switching terminal, and a common terminal connected to the second terminal of an ith capacitor, in each of the first switch to the Nth switch in the first switch array, the first analog input signal is applied to the first switching terminal, the power supply voltage is applied to the second switching terminal, and the ground voltage is applied to the third switching terminal, in each of the first switch to the Nth switch in the second switch array, the second analog input signal is applied to the first switching terminal, the power supply voltage is applied to the second switching terminal, and the ground voltage is applied to the third switching terminal, the control circuit connects the first switching terminal to the common terminal in each of the first switch to the Nth switch of each of the first switch array and the second switch array in the sampling period, and determines a value of each bit of the digital output signal by the binary search on a basis of the comparison result signal in a state in which the second switching terminal or the third switching terminal is selectively connected to the common terminal in each of the first switch to the Nth switch of each of the first switch array and the second switch array in the successive approximation period following the sampling period, and N denotes an integer of 2 or more, and i denotes a natural number equal to or less than N.

* * * * *